(12) United States Patent
Dubowsky et al.

(10) Patent No.: US 7,411,331 B2
(45) Date of Patent: Aug. 12, 2008

(54) DIELECTRIC ELASTOMER ACTUATED SYSTEMS AND METHODS

(75) Inventors: Steven Dubowsky, Boston, MA (US); Moustapha Hafez, Paris (FR); Matthew Lichter, Somerville, MA (US); Peter Weiss, Eichenau (DE); Andreas Wingert, Baindt (DE)

(73) Assignee: Massachusetts Institute of Technology, Boston, MA (US)

(*) Notice: Subject to any disclaimer, the term of this patent is extended or adjusted under 35 U.S.C. 154(b) by 0 days.

(21) Appl. No.: 10/291,217

(22) Filed: Nov. 8, 2002

(65) Prior Publication Data

US 2003/0218403 A1 Nov. 27, 2003

Related U.S. Application Data

(60) Provisional application No. 60/379,465, filed on May 10, 2002.

(51) Int. Cl.
 *H02N 1/00* (2006.01)
(52) U.S. Cl. .................................................. 310/309
(58) Field of Classification Search ................ 310/309; 417/413.1–413.2; 200/181
 See application file for complete search history.

(56) References Cited

U.S. PATENT DOCUMENTS

| | | | |
|---|---|---|---|
| 3,832,580 A | 8/1974 | Yamamuro et al. | 310/9.5 |
| 4,845,431 A | 7/1989 | Sullenberger | 324/318 |
| 5,049,821 A | 9/1991 | Duensing et al. | 324/322 |
| 5,130,656 A | 7/1992 | Requardt et al. | 324/318 |
| 5,150,710 A | 9/1992 | Hall et al. | 128/653.5 |

(Continued)

FOREIGN PATENT DOCUMENTS

DE 274 765 1/1990

(Continued)

OTHER PUBLICATIONS

Translation of JP 05-253175, "Electrostatic Type Actuator", Ota, May 1993.*

(Continued)

*Primary Examiner*—Karl Tamai
(74) *Attorney, Agent, or Firm*—Choate, Hall & Stewart LLP

(57) ABSTRACT

The system of the present invention includes an actuator having at least two electrodes, an elastomeric dielectric film disposed between the two electrodes, and a frame attached to the elastomeric dielectric film. The frame provides a linear actuation force characteristic over a displacement range. The displacement range is preferably the stroke of the actuator. The displacement range can be about 5 mm and greater. Further, the frame can include a plurality of configurations, for example, at least a rigid members coupled to a flexible member wherein the frame provides an elastic restoring force. In preferred embodiments, the rigid member can be, but is not limited to, curved beams, parallel beams, rods and plates.

In a preferred embodiment the actuator can further include a passive element disposed between two flexible members such as, for example, links to tune a stiffness characteristic of the actuator. The passive element can be a bi-stable element. Further, the actuator can include a plurality of layers of the elastomeric dielectric film integrated into the frame. The elastomeric film can be made of different materials such as, for example, acrylic, silicone and latex.

24 Claims, 36 Drawing Sheets

U.S. PATENT DOCUMENTS

| | | | | |
|---|---|---|---|---|
| 5,206,557 | A | * | 4/1993 | Bobbio ........................ 310/309 |
| 5,356,500 | A | | 10/1994 | Scheinbeim et al. ........ 156/229 |
| 5,365,928 | A | | 11/1994 | Rhinehart et al. ........ 128/653.5 |
| 5,440,194 | A | | 8/1995 | Beurrier ...................... 310/328 |
| 5,502,387 | A | | 3/1996 | McGill ........................ 324/318 |
| 5,836,750 | A | * | 11/1998 | Cabuz ......................... 417/322 |
| 6,157,276 | A | | 12/2000 | Hedeen et al. .............. 335/216 |
| 6,215,307 | B1 | | 4/2001 | Sementchenko ............ 324/318 |
| 6,303,885 | B1 | * | 10/2001 | Hichwa et al. .............. 200/181 |
| 6,343,129 | B1 | | 1/2002 | Pelrine et al. ............... 381/191 |
| 2001/0026165 | A1 | | 10/2001 | Pelrine et al. ............... 324/750 |
| 2001/0032663 | A1 | | 10/2001 | Pelrine et al. ............... 136/205 |
| 2001/0035723 | A1 | | 11/2001 | Pelrine et al. ............... 318/116 |
| 2001/0036790 | A1 | | 11/2001 | Kornbluh et al. ............ 446/337 |
| 2001/0045104 | A1 | | 11/2001 | Bailey, Sr. et al. ............. 62/510 |
| 2002/0008445 | A1 | | 1/2002 | Pelrine et al. ............... 310/330 |
| 2002/0008516 | A1 | | 1/2002 | Dietz et al. ................. 324/318 |
| 2002/0117517 | A1 | | 8/2002 | Unger et al. ................ 222/214 |

FOREIGN PATENT DOCUMENTS

| | | |
|---|---|---|
| EP | 1 101 442 | 5/2001 |
| EP | 1 195 523 | 4/2002 |
| JP | 5-253175 | * 5/1993 |
| JP | 08257010 A | 10/1996 |
| JP | 2001294642 | 10/2001 |
| KR | 285912 | 1/2001 |
| WO | WO 98/35529 | 8/1998 |
| WO | WO 99/59479 | 11/1999 |
| WO | WO 00/46278 | 8/2000 |
| WO | WO 00/64003 | 10/2000 |
| WO | WO 01/06575 | 1/2001 |
| WO | WO 01/06579 | 1/2001 |
| WO | WO 01/31716 | 5/2001 |
| WO | WO 01/45786 | 6/2001 |
| WO | WO 01/50584 | 7/2001 |
| WO | WO 02/11648 | 2/2002 |

OTHER PUBLICATIONS

"On the Kinematics of Parallel Mechanisms with Bi-Stable Polymer Actuators", Wingert et al., Proceedings of the 8$^{th}$ International Symposium on Advances in Robotic Kinematics, Jun. 2002.*

"Hyper-Redundant Robot Manipulators Actuated by Optimized Binary Dielectric Polymers", Wingert et al., Smart Structures an Materials Symposium, Mar. 2002.*

Pelrine R., et al., "Dielectric Elastomer Artificial Muscle Actuators: Toward Biomimetic Motion," Proceedings of SPIE, vol. 4695, pp. 126-137, Jul. 2002.

Benslimane, M., et al., "Mechanical properties of Dielectric Elastomer Actuators with smart metallic compliant electrodes," Proceeding of SPIE, vol. 4695, pp. 150-157, Jul. 2002.

Toth, L.A. and Goldenberg, A.A., "Control System Design for a Dielectric Elastomer Actuator: the Sensory Subsystem," Proceedings of SPIE, vol. 4965, pp. 323-334, Jul. 2002.

Sommer-Larsen, P., et al., "Performance of dielectric elastomer actuators and materials," Proceedings of SPIE, vol. 4695, pp. 158-166, Jul. 2002.

Choi, H., et al., "Biomimetic Actuator Based on Dielectric Polymer," Proceedings of SPIE, vol. 4695, pp. 138-149, Jul. 2002.

Choi, H. R., et al., "Soft Actuator for Robotic Applications Based on Dielectric Elastomer: Quasi-static Analysis," Proceedings of the 2002 IEEE, pp. 3212-3217 (May 2002).

Choi, H. R., et al., "Soft Actuator for Robotic Applications Based on Dielectric Elastomer: Dynamic Analysis and Applications," Proceeding of the 2002 IEEE, pp. 3218-3223 (May 2002).

Pelrine, R. E., et al., "Electrostriction of polymer dielectrics with compliant electrodes as a means of actuation," Sensors and Actuators A 64, pp. 77-85 (Jan. 1998).

Pelrine, R., et al., "Electrostriction of Polymer Films for Microactuators," IEEE, pp. 238-243 (Jan. 1997).

Pelrine, R., et al., "High-Strain Actuator Materials Based on Dielectric Elastomers," Adv. Mater. 12, No. 16, pp. 1223-1225 (Aug. 16, 2000).

Pelrine, R., et al., "High-Speed Electrically Actuated Elastomers with Strain Greater Than 100%," Science vol. 287, pp. 836-839 (Feb. 4, 2000).

Pelrine, R., et al., "High-field deformation of elastomeric dielectrics for actuators," Materials Science and Engineering C 11, pp. 89-100 (Jan. 2000).

Kornbluh, R., et al., "Electrostrictive Polymer Artificial Muscle Actuators," Proceedings of the 1998 IEEE, pp. 2147-2154, (May 1998).

Kornbluh, R., et al., "Electroelastomers: Applications of Dielectric Elastomer Transducers for Actuation, Generation and Smart Structures," www.erg.sri.com, No date given, Nov. 8, 2002.

Heydt, R., et al., "Acoustical performance of an electrostrictive polymer film loudspeaker," J. Acoust. Soc. Am 107 (2), pp. 833-839 (Feb. 2000).

Heydt, R., et al., "Design and Performance of an Electrostrictive-Polymer-Film Acoustic Actuator," Journal of Sound and Vibration 215(2), pp. 297-311 (Jan. 1998).

Chinzei, K., et al., "Surgical Assist Robot for the Active Navigation in the Intraoperative MIR: Hardware Design Issues," Proceedings of the 2000 IEEE, pp. 727-732 (Jan. 2000).

Kofod, G., "Dielectric elastomer actuators," Unpublished doctoral dissertation, Technical University of Denmark, (Dec. 2001).

Park, K. C., et al., "An Electrostrictive Polymer Actuator Control System," Proceedings of the 2001 IEEE, pp. 470-475 (Nov. 3, 2001).

Cho, S., et al., "Compliant Micro Actuator made from Dielectric Polymer," Paper presented at the meeting of the International Conference on Control, Automation and Systems, (Oct. 2001).

Kornbluh, R., et al., "High-field electrostriction of elastomeric polymer dielectrics for actuation," Proceedings f the SPIE International Symposium (Mar. 1999).

Kornbluh, R., et al., "Ultrahigh strain response of field-actuated elastomeric polymers," Proceedings of SPIE vol. 3987 pp. 51-64 (Jan. 2000).

Pelrine, R., et al., "Artificial Muscle for Small Robots," www.erg.sri.com (Jan. 17, 2001).

Pelrine, R., et al., "Dielectric Elastomers Generator Mode Fundamentals and Applications," Proceedings of SPIE vol. 4329, pp. 148-156 (Jan. 2001).

Pelrine, R., et al., "Applications for Dielectric Elastomer Actuators," Proceedings of SPIE vol. 4329, (Mar. 4-8, 2001).

Eckerle, J., et al., "A Biologically Inspired Hexapedal Robot Using Field-Effect Electroactive Elastomer Artificial Muscles," Proceedings of SPIE vol. 4329, pp. 1-12 (Mar. 4-8, 2001).

Kofod, G., et al., "Actuation response of polyacrylate dielectric elastomers," Proceedings of SPIE vol. 4329, pp. 141-147 (Jan. 2001).

Cho S., et al., "Development of Micro Inchworm Robot Actuated by Electrostrictive Polymer Actuator," No date given, Jul. 2001.

Grimm, R.C. and Ehman, R.L., "Minimizing Signal Loss from Electromechanical Drivers in MR Elastography," Proc. Intl., Soc, Mag. Reson. Med. 10 (Jan. 2002).

Jeon, J. W., et al., "Electrostrictive Polymer Actuators and Their Control Systems," Proceedings of SPIE vol. 4329, pp. 380-388 (Jan. 2001).

Cho., S. et al., "Electrostrictive Polymer Actuator Using Elastic Restoring Force," Proceedings of the IMS (Apr. 19-21, 2001).

Chinzei, K., et al., "MR Compatibility of Mechatronic Devices: Design Criteria," No date given, Jan. 1999.

Venook, R., et al., "Autotuning Electronics for Varactor Tuned, Flexible Interventional RF Coils," Proc. Intl. S c. Mag. Reson. Med. 10 (Jan. 2002).

Leussler, Ch., et al., "Intrinsic Hybrid Surface Coil Array for Improved SNR in Cardiac MRI," Proc. Intl. Soc. Mag. Reson. Med. 10 (Jan. 2002).

Sujan et al., "Lightweight hyper-redundant binary elements for planetary exploration robots," *IEEE*, pp. 1273-1278, Jul. 2001.

* cited by examiner

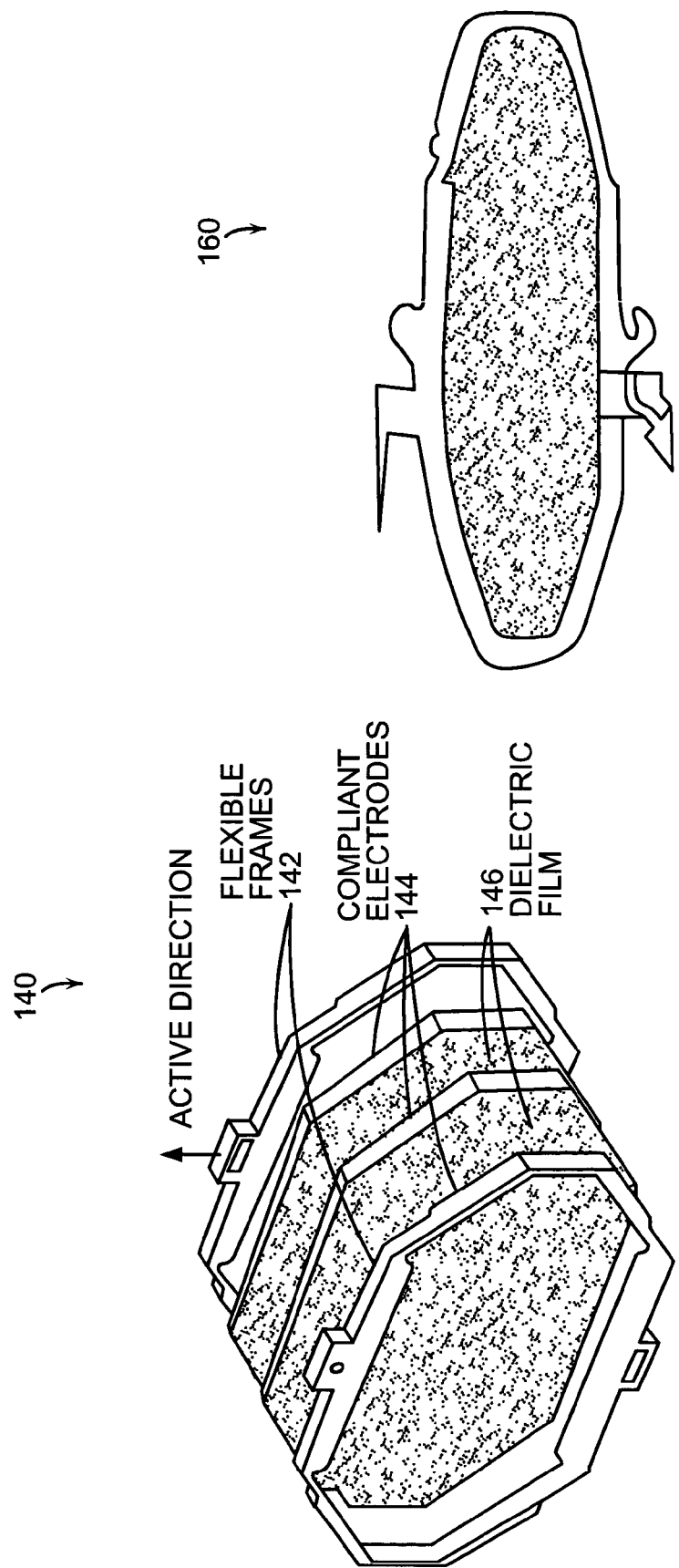

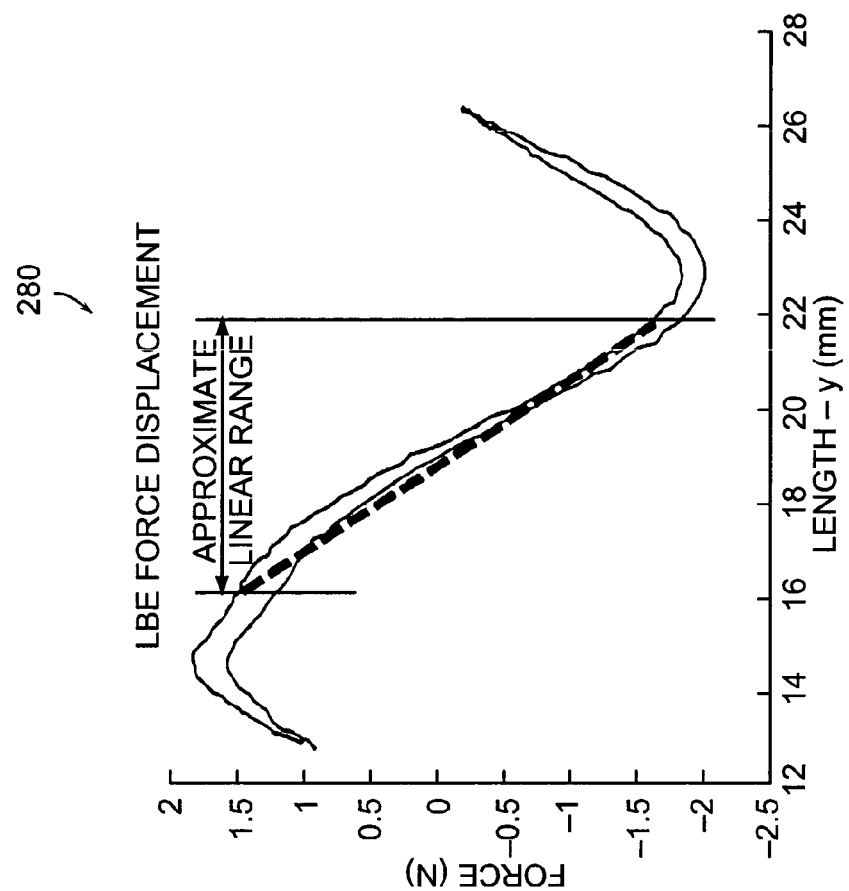
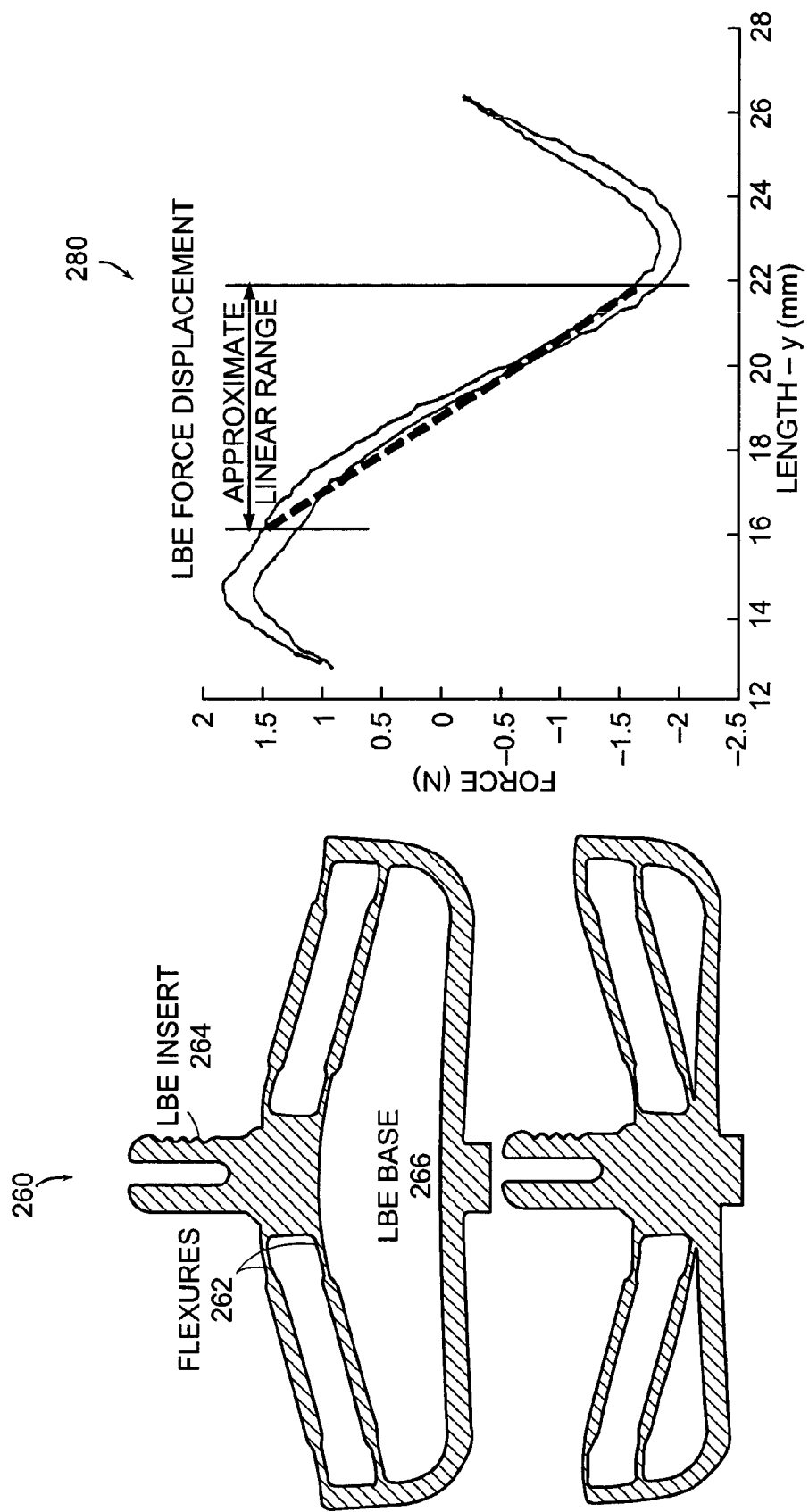
Figure 7A
Figure 7B

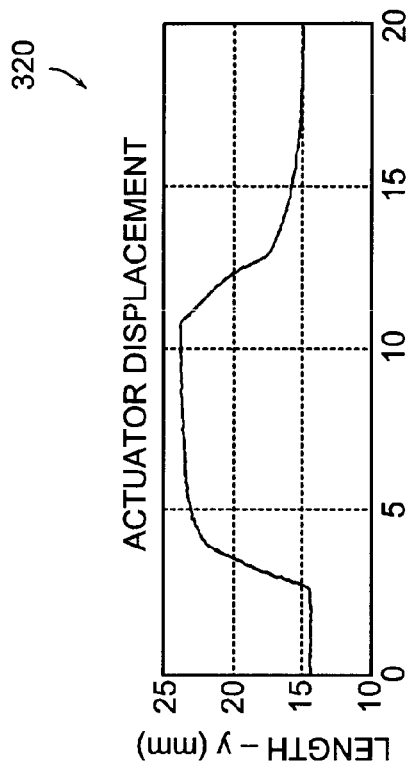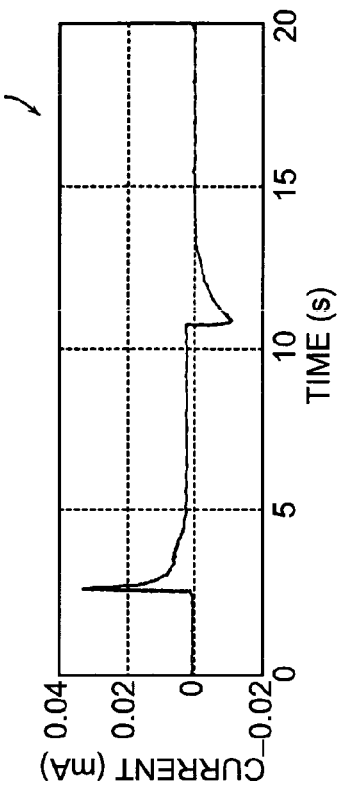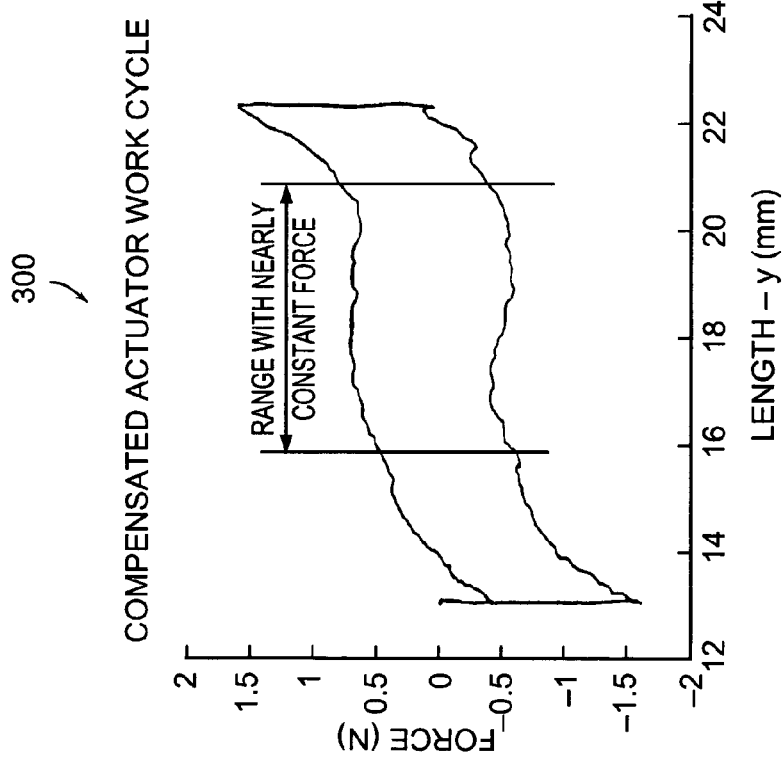

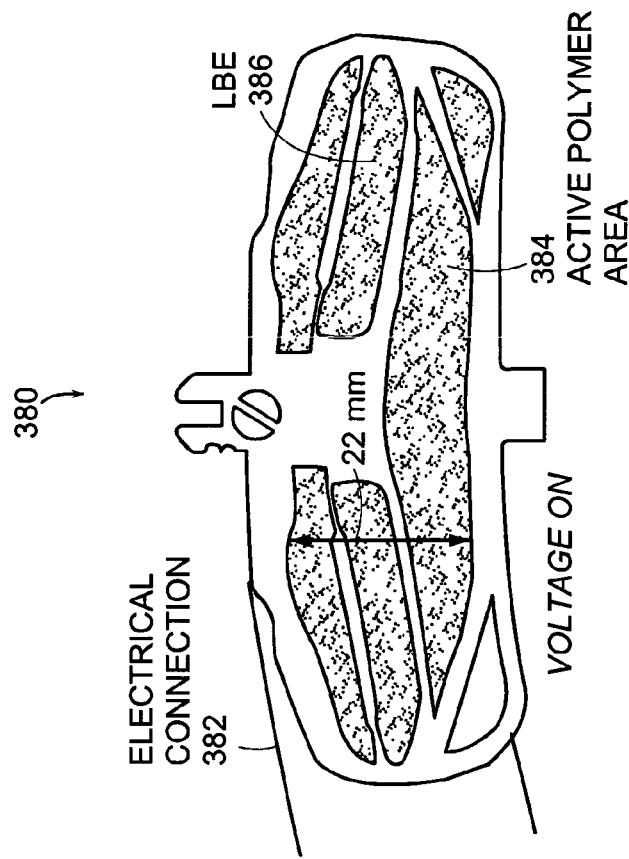
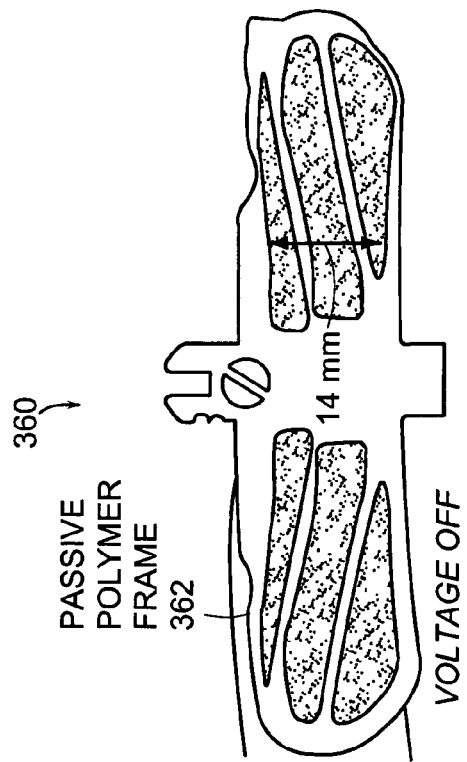
Figure 9B
Figure 9A

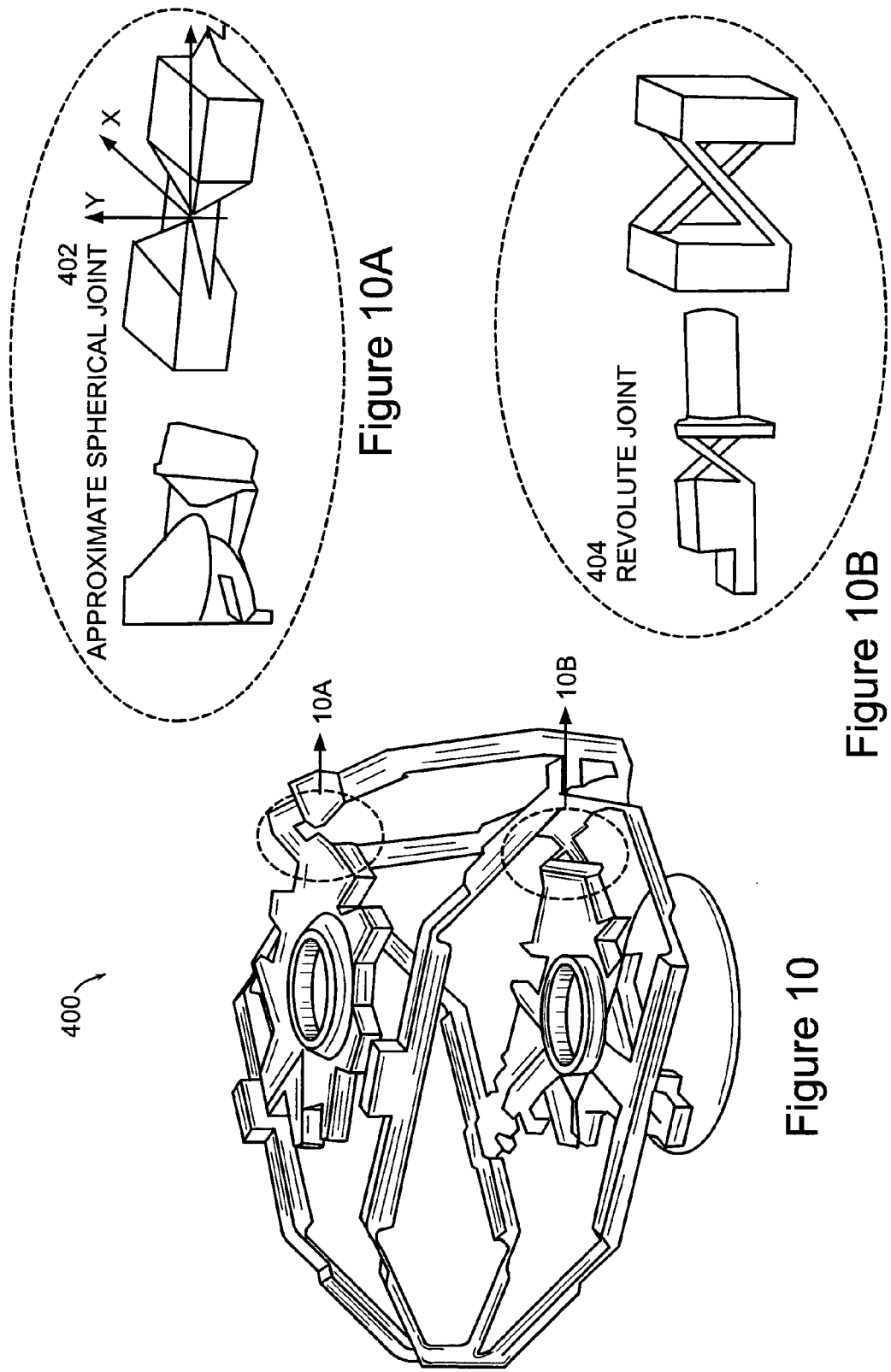

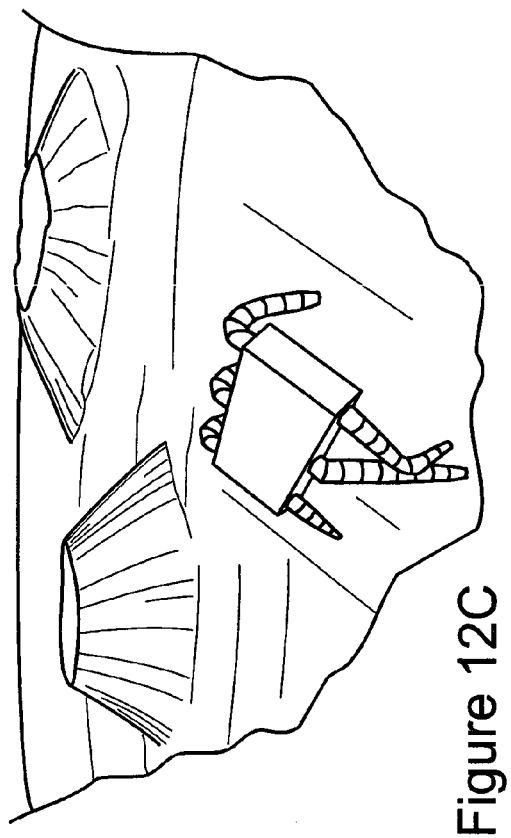
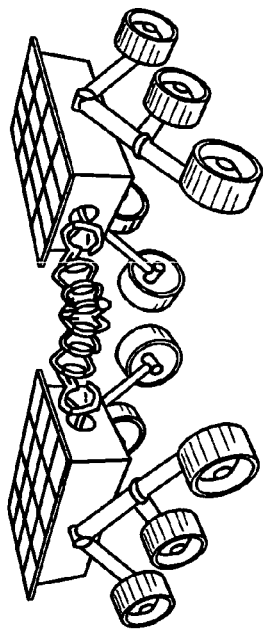
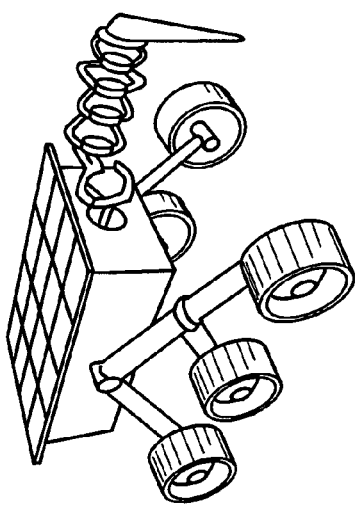
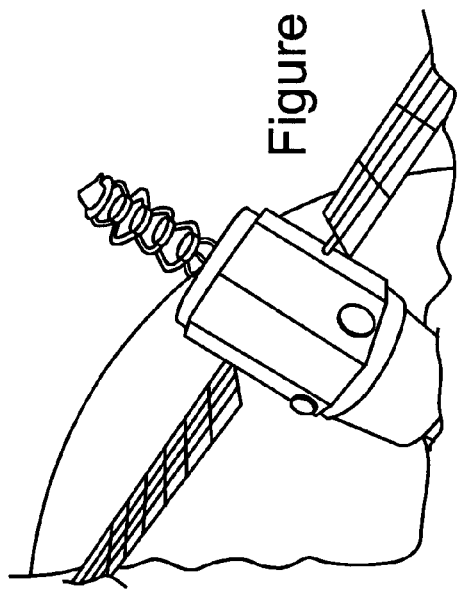
Figure 12A
Figure 12B
Figure 12C
Figure 12D

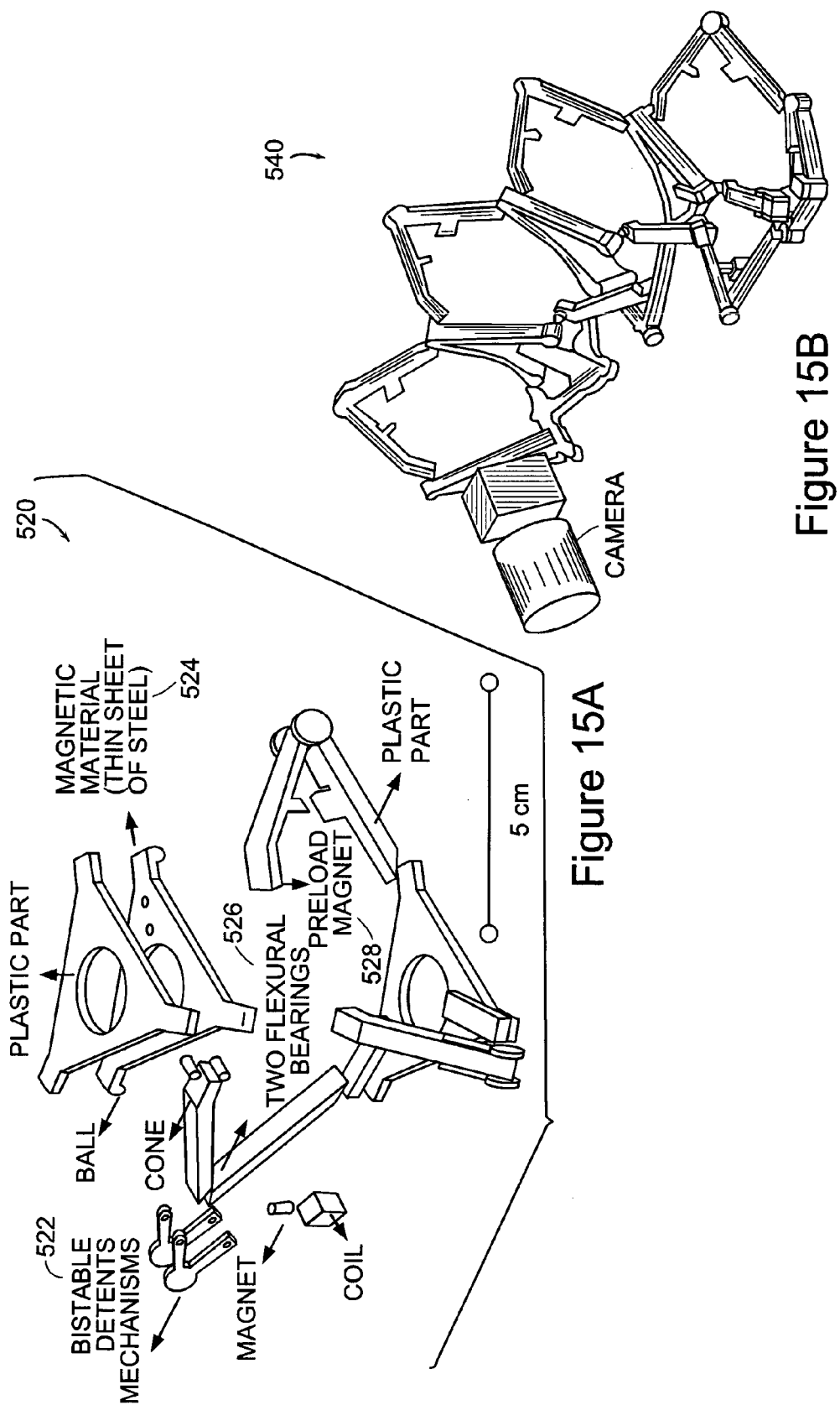

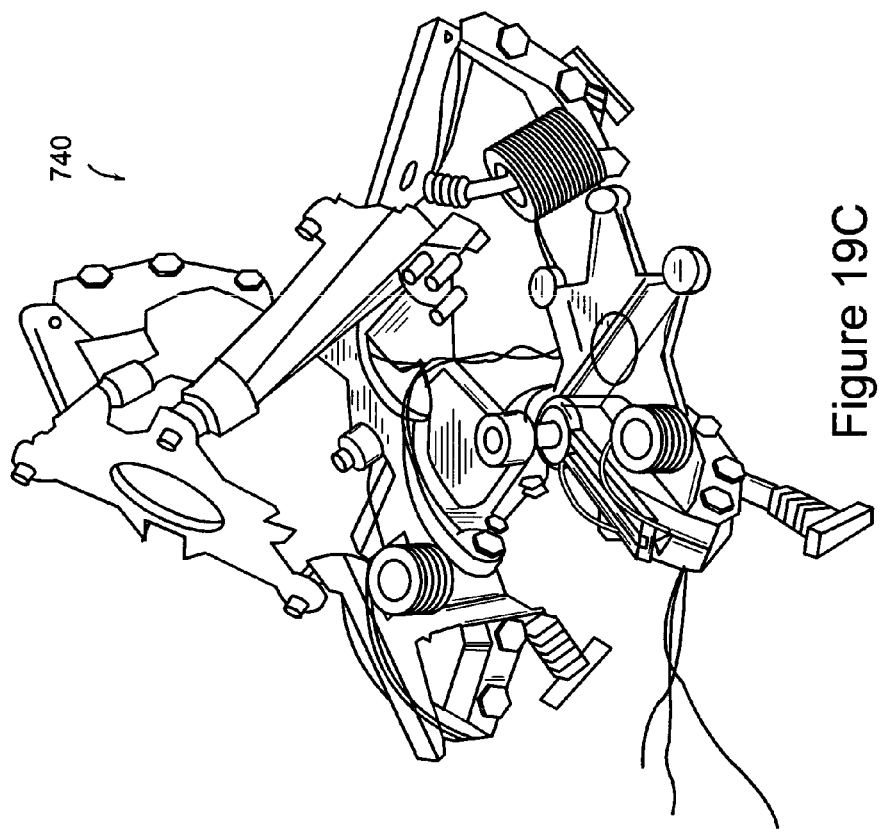
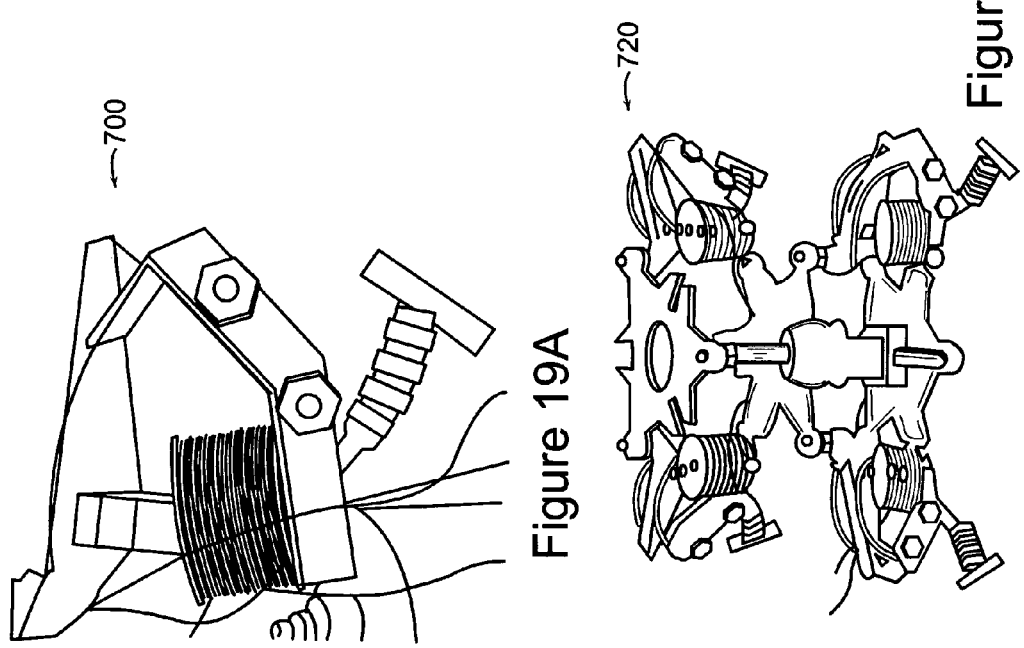

HEXAGONAL-SHAPED FRAMES

FLEXIBLE DIAMOND-SHAPED FRAMES

1140

→ Direction of motion

1142
Active regions

1144
Actuated region

1146
Polymer tube

DIELECTRIC ELASTOMER ACTUATED SYSTEMS AND METHODS

CROSS REFERENCES TO RELATED APPLICATIONS

The present application claims the benefit of the U.S. Provisional Patent Application No. 60/379,465 filed May 10, 2002. The entire contents of the above application is incorporated herein by reference in its entirety.

GOVERNMENT SUPPORT

This invention was made with government support under Prime NASA Grant Number NAS5, under an agreement with the University Space Research Association Contract Number SUB AGMT USRA 07600-033. The Government has certain right in the invention.

BACKGROUND OF THE INVENTION

In many applications, it is desirable to convert between electrical energy and mechanical energy. Exemplary applications requiring translation from electrical to mechanical energy include robotics, pumps, speakers, general automation, disk drives and prosthetic devices. These applications include one or more actuators that convert electrical energy into mechanical work—on a macroscopic or microscopic level. Common electric actuator technologies, such as electromagnetic motors and solenoids, are not suitable for many of these applications, e.g., when the required device size is small (e.g., micro or mesoscale machines).

Further, proposed tasks for future robotic systems, ranging from space exploration to medical devices, will require robotic devices and components that are simple, robust, lightweight, inexpensive, and easy to control. Hyper-redundant binary systems have been proposed to meet this need. It has been shown that performance of a binary robotic system approaches that of a continuous system, as the number of degrees of freedom (DOF) increases. However, high DOF systems are not feasible with conventional components. A major limitation is the actuator technology. Thus, there is still a need for alternate actuator devices to convert between electrical and mechanical energy.

SUMMARY OF THE INVENTION

The system of the present invention includes an actuator having at least two electrodes, an elastomeric dielectric film disposed between the two electrodes, and a frame attached to at least a portion of the elastomeric dielectric film. The frame provides a linear actuation force characteristic over a displacement range. The linear actuation force characteristic is defined as being within ±20% and preferably within 10% of the actuation force over a displacement range. In an embodiment, the frame preferably provides a constant actuation force over a displacement range. The displacement range is preferably the stroke of the actuator. The displacement range can be about 5 mm and greater, for example. Further, the frame can include a plurality of configurations, for example, at least a rigid member coupled to a flexible member wherein the frame provides an elastic restoring force. In preferred embodiments, the rigid member can be, but is not limited to, curved beams, parallel beams, rods and plates.

In a preferred embodiment the actuator can further include a passive element disposed between two flexible members such as, for example, links to tune a stiffness characteristic of the actuator. The passive element can be a bi-stable element. Further, the actuator can include a plurality of layers of the elastomeric dielectric film integrated into the frame. The elastomeric film can be made of different materials such as, for example, acrylic, silicone and latex.

In a preferred embodiment, the actuator includes a resilient member such as a spring to provide a restoring force to obtain a constant force over displacement characteristic.

In accordance with a preferred embodiment, a system of the present invention includes a medical actuator, having an elastomeric film coated on at least a portion of a first and a second surface with a first and a second compliant electrode, and a frame attached to the elastomeric film. The frame provides a constant actuation force defined as being within ±20% and preferably within 10% of the actuation force over a displacement range. The displacement range covers preferably a portion or the entire stroke of the actuator. The frame includes at least two beams coupled with a plurality of flexible links. The elastomeric film can include a plurality of layers of acrylic or silicone.

In accordance with another aspect of the present invention, a system of the present invention includes a positioning device for use in fixturing an object having a plurality of actuators having a polymer film with a first surface and a second surface, a first and second electrode disposed on the first and second surface, a frame attached to each of the polymer films, the frame having at least two parallel beams coupled with a plurality of links to provide a restoring force, and an electrically resizable coil disposed on the surface of the polymer film to remotely locate the object. Further, the positioning device includes a bi-stable passive element coupled to the plurality of links.

In accordance with a preferred embodiment, the system of the present invention includes a motor comprising a polymer actuator structure disposed in a frame, the polymer actuator structure has a plurality of layers of polymer films disposed between two compliant electrodes, and an elongate shaft defining a first and second region of the polymer actuator structure, wherein actuation of at least one of the first or second region shifts the shaft.

Another preferred embodiment of the present invention includes a pump to advance fluid comprising a tube formed of polymer film, the tube being divided into a plurality of sections, each of the sections have a first and second compliant electrode disposed on an inner and outer electrode. Each of the sections are individually actuated to expand.

Preferred embodiments include a conical actuator, a cylindrical actuator or an actuator having parallel beams. Applying a voltage across the electrodes causes the film to expand in area allowing the parallel beams to separate or the cone to expand in height or the cylindrical shell to expand in length.

Alternate preferred embodiments include a resilient elastic element, such as a spring to provide a restoring force. The resilient element can be combined with the embodiments including an actuator having parallel beams, a conical and/or cylindrical actuator.

Preferred embodiments of the present invention are included in binary robotic devices, peristaltic pumps, ventilation valves, and manipulator devices that can be used for, but not limited to, surgical applications and/or space applications.

The foregoing and other features and advantages of the dielectric elastomer actuated systems and methods will be apparent from the following more particular description of preferred embodiments of the system and method as illustrated in the accompanying drawings in which like reference characters refer to the same parts throughout the different views.

BRIEF DESCRIPTION OF THE DRAWINGS

FIG. 4A is an exploded view of an actuator module with a plurality of elastomer films integrated into a flexible frame in accordance with a preferred embodiment of the present invention.

FIG. 4B is a photograph of the embodiment diagrammatically illustrated in FIG. 4A.

FIGS. 7A and 7B illustrate a linear bi-stable element (LBE) and its corresponding force-displacement characteristics in accordance with a preferred embodiment of the present invention.

FIGS. 8A-8C graphically illustrate the performance of a compensated actuator model, specifically force displacement (work cycle) and the displacement and current curves, respectively, in accordance with a preferred embodiment of the present invention.

FIGS. 9A and 9B illustrate an embedded flexible-frame actuator in two states in accordance with a preferred embodiment of the present invention.

FIGS. 10, 10A and 10B illustrate a skeletal framework of a binary actuated device in accordance with a preferred embodiment of the present invention hereinafter referred to as FIG. 10.

FIGS. 12A-12D illustrate preferred embodiments of the present invention in space robotic applications.

FIGS. 15A and 15B illustrate the system architecture of a binary actuated device having electromagnetic actuators in combination with an elastomeric actuator in accordance with a preferred embodiment of the present invention.

FIGS. 19A-19C illustrate embodiments of devices having bi-stable mechanisms in accordance with the present invention.

The drawings are not necessarily to scale, emphasis instead being placed upon illustrating the principles of the invention.

DETAILED DESCRIPTION OF THE INVENTION

In recent years, important progress has been made in the area of dielectric elastomer actuators. Measurements and analysis suggests that dielectric elastomer actuators have the potential of overcoming limitations of conventional actuators and serving as a key component for high degrees of freedom (DOF) binary manipulators and devices, as well as conventional continuously actuating devices. Under controlled conditions, dielectric elastomer actuators have achieved very high energy densities.

Figure 1B:
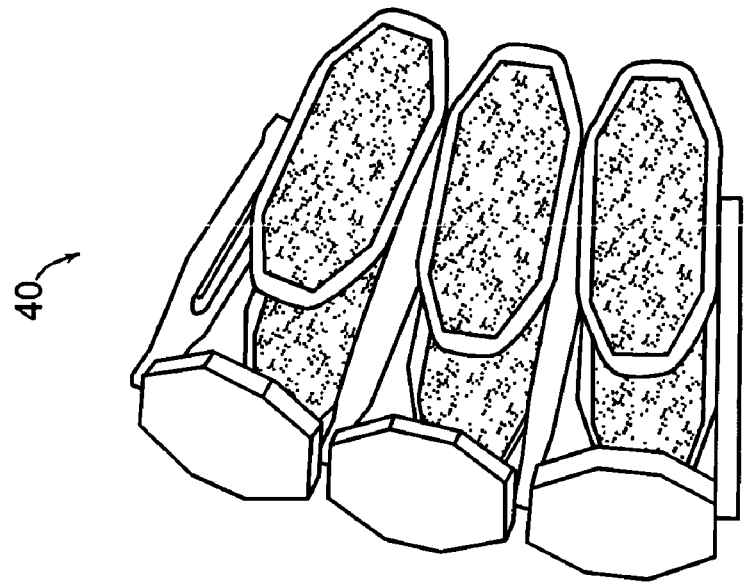
FIGS. 1A and 1B are diagrams of a single stage and multistage dielectric polymer actuated in accordance with preferred embodiments of the present invention.
Figure 1A:
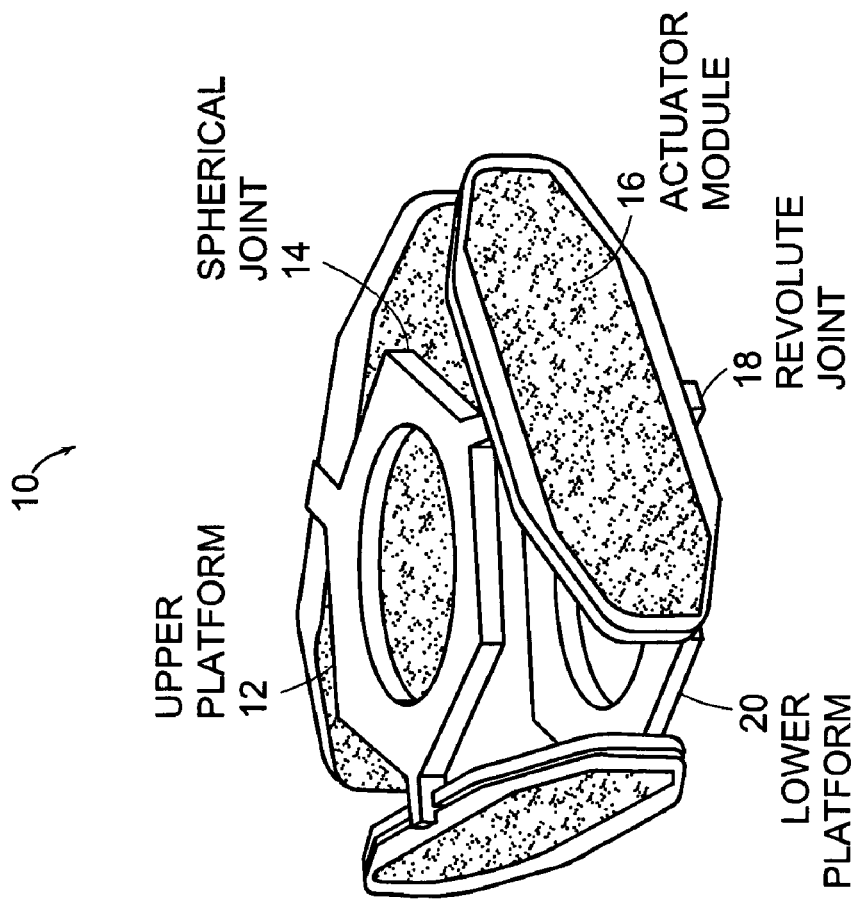

The preferred embodiment of the present invention includes a high DOF binary device driven by modular dielectric elastomer based actuators. The actuator consists of an integrated module consisting of the elastomer film, an elastic frame and a passive elastic element. The elastomer film can be made from many polymer materials such as, for example, but not limited to, acrylic, silicone and latex. Further, the dielectric polymer can be selected from the group including, but not limited to, essentially of silicone, fluorosilicone, fluoroelastomer, natural rubber, polybutadiene, nitrile rubber, isoprene and ethylene propylene diene. The actuator module applies boundary conditions that enhance the performance of elastomeric films. The actuator module can work under both tension and compression and has a linearly constant force through its stroke. It can be implemented into mechanical systems without the need of external restoring forces. The actuator module is used to actuate a computer controlled element such as, for example, a Binary Robotic Articulated Intelligent Device (BRAID), shown in FIGS. 1A and 1B. The BRAID is a lightweight, hyper-redundant binary manipulator that can have a large number of embedded actuators 16. The embodiment demonstrates feasibility of the modular dielectric elastomer actuators.

Figure 2A:
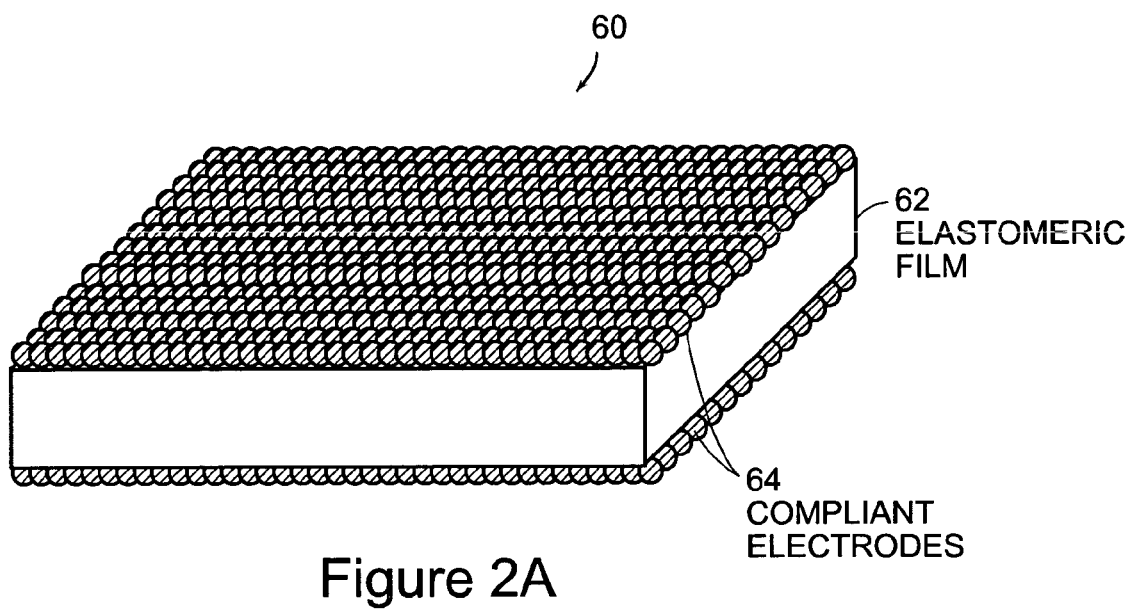
FIGS. 2A and 2B diagrammatically illustrate the operating principle of dielectric elastomer actuators in accordance with preferred embodiments of the present invention.
Figure 2B:
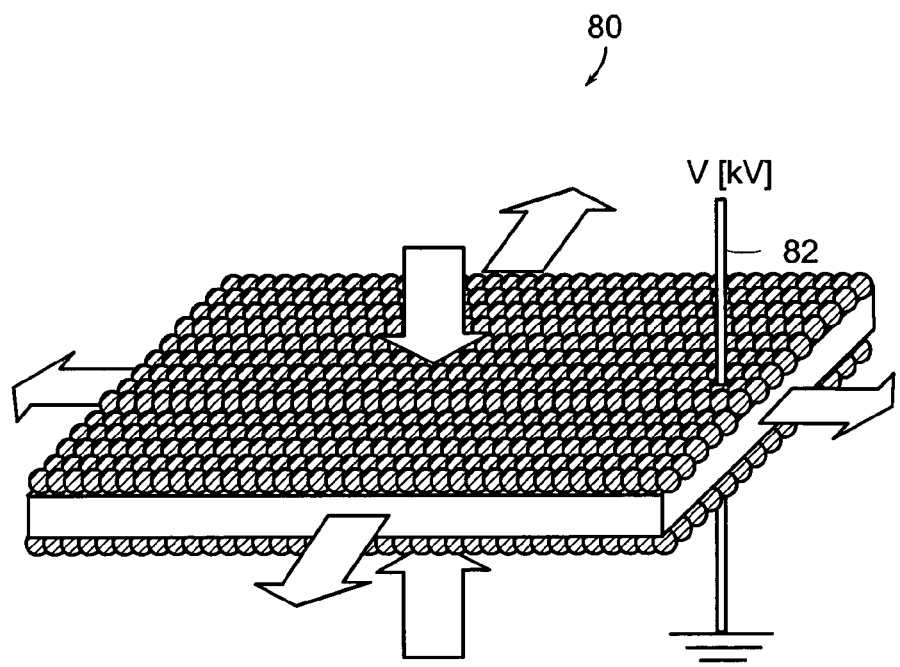

The operating principle of a dielectric elastomer actuator is simple and shown in FIGS. 2A and 2B. An elastomeric film 62 is coated on both sides with compliant electrodes 64. The compliant electrodes are made from a group including essentially, but not limited to, carbon conductive polymers and thin metal films. As a voltage is applied across the electrodes 64, electrostatic forces cause the film to compress in thickness and expand in area. This area expansion can be used to actuate mechanical systems. The individual films can be layered to increase actuation forces.

Dielectric elastomers can be used in linear actuators, loudspeakers, solid state optical devices, rotary drives and as generators. A variety of geometric configurations convert the area expansion of the film to linear motion. For example, the actuator film can be constrained in planar frames or be rolled into tubes that change length. In these embodiments, the direction of the actuator motion is in the same plane as the film expansion. An example of an out-of-plane device in accordance with an embodiment of the present invention is a cone-shaped actuator, in which the motion can be nearly normal to the undeformed film.

Planar geometries of dielectric elastomer actuators have been proposed to power a snake-like manipulator and an insect-inspired hexapedal walker. A conical geometry has been proposed to power an inchworm robot. Since the actuators only work in tension, some external restoring force is required, which can be achieved in a variety of ways. For the case of the snake-like manipulator, each degree of freedom is controlled by an antagonistic pair of actuators. The hexapedal walker and the inchworm robot use return springs to provide the restoring force.

For the actuator in accordance with a preferred embodiment, the restoring force is provided by a flexible frame that is directly bonded to at least a portion of the elastomeric film, resulting in a compact actuator module with embedded actuation.

A dielectric elastomer used in a preferred embodiment, for example, can be, but not limited to, silicone or acrylics such as, VHB™ 4910 provided by 3M Corporation of St. Paul, Minn. and sold as an adhesive tape. This is a very elastic material and has been shown to produce the greatest strains and energy densities in laboratory demonstrations. Up to 380% strain has been reported. However, such high strains have not been reported for actuators when the material is used in practical applications. This is due to the fact that in applications the boundary conditions that maximize performance are not maintained. The modular actuator in accordance with the present invention minimizes and preferably eliminates this problem.

In a preferred embodiment, the dielectric elastomer that separates the electrodes experiences an electrostatic pressure as a charge is applied to the electrodes. If both the dielectric material and the electrodes are compliant, as they conform to the changing shape of a polymer, then the effective pressure is given by $$p = \varepsilon \varepsilon_0 E^2 = \varepsilon \varepsilon_0 \left(\frac{V}{z}\right)^2 \tag{1}$$

where $\in$ is the relative dielectric constant, $\epsilon_o$ is the permittivity of free space, and E is the applied electric field, which is the ratio of the applied voltage (V) over the film thickness (z). In general, the larger the effective pressure, the larger the actuator strain obtained.

Understanding the implication of this equation is useful in actuator design. Equation 1 suggests that a high effective pressure results from a large electric field. The maximum electric field that can be applied to the film without damaging it is the electric breakdown field. The breakdown field for VHB™ 4910 increases by more than an order of magnitude with pre-stretching of the film. Since the electric field term (E) in Equation 1 is squared, pre-stretching this material can increase the maximum attainable effective pressure by at least an order of magnitude. To fully exploit the potential of dielectric elastomer actuators, the pre-stretching boundary conditions on the film are important. The amount of pre-stretching of the film also affects the dielectric constant, however its variance with pre-strain is small and therefore believed to be less significant in actuator development.

Figure 3A:
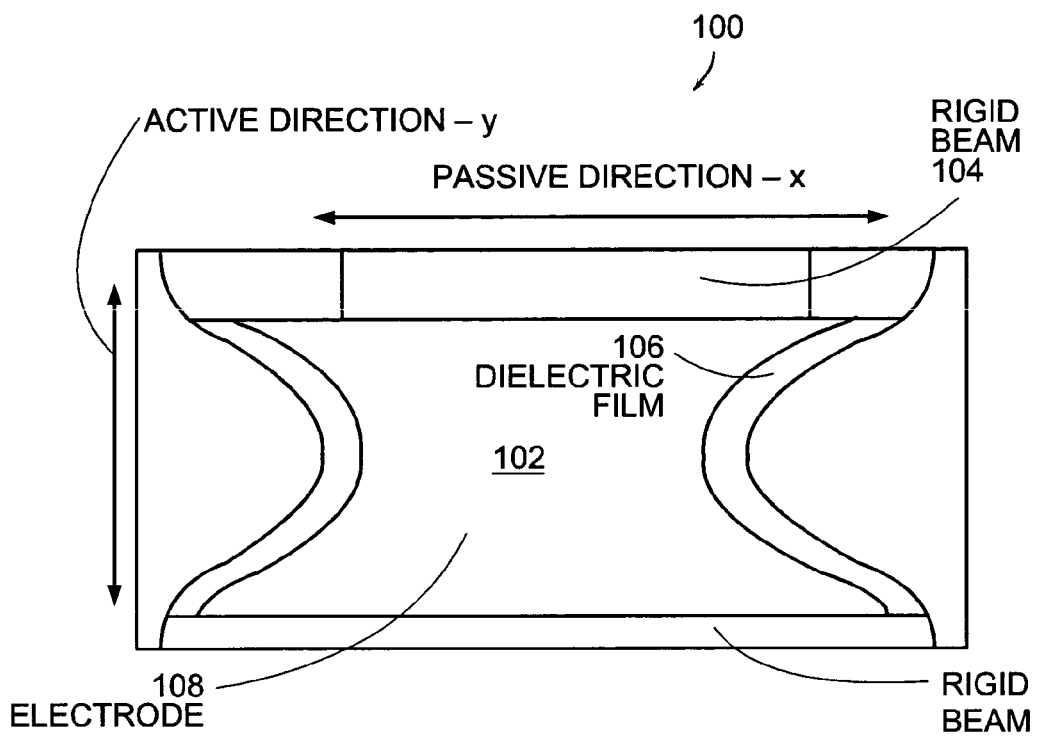
FIGS. 3A and 3B schematically illustrate a prior art method and a method of implementing dielectric elastomer actuators in accordance with a preferred embodiment of the present invention, respectively, including a linear dielectric elastomer actuator having a flexible frame.

A simple way to produce linear motion with dielectric actuators is to stretch the two parallel beams, as shown in FIG. 3A. As a voltage is applied to the electrodes, the film expands in area and allows the beams to separate if they are pre-loaded. Pre-stretching the film reduces the thickness of the film, which in turn reduces the voltage to achieve a given electric field. The vertical sides of the film are free, allowing the film to bow in.

From FIG. 3A it is evident that the amount of pre-stretching in the passive direction is not uniform throughout the actuator film 106. Since the film is largely incompressible (constant volume), it is thin close to the beams 104 and thicker at the center. Applying an electric potential across the electrodes creates a non-uniform pressure and deformation of the film. Thus, not all areas of the film are actuated fully. Since the film is not constrained in the passive directions, it exhibits some motion in that direction upon actuation. This motion does not produce useful mechanical work. It is desirous to maintain the pre-stretched boundary conditions on the film without interfering with the desired motion of the actuator. In one embodiment, in order to ensure uniformity in the film, the aspect ratio of the actuator is increased by increasing the width (x) and reducing the height (y). However, such geometry is inappropriate for many applications.

Figure 3B:
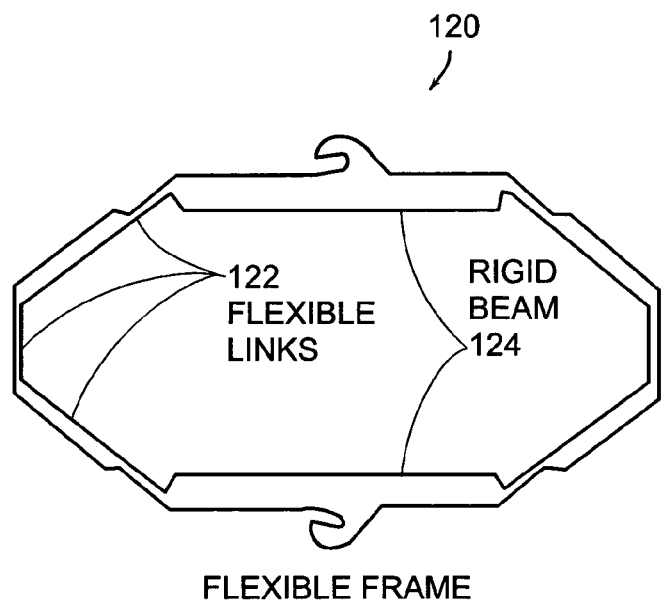

In a preferred embodiment, to solve this problem, the film can be incorporated into a flexible frame 122, as shown in FIG. 3B. The frame 120 consists of two parallel beams 124 that are connected with flexible links 122. The frame geometry is designed such that all areas of film undergo approximately equal expansion under actuation. The frame is a monolithic piece of Delrin®. Flexibility is provided by reducing the wall thickness in certain areas. The film is placed between two such frames.

A second function of the frame is that it provides an elastic restoring force that permits the actuator to work under both tension and compression. A welcome side-effect of the frame is that the risk of tearing of the film at its exposed edges is greatly reduced. The frame also prevents current arcs from developing around the edges of the film.

Figure 18C:
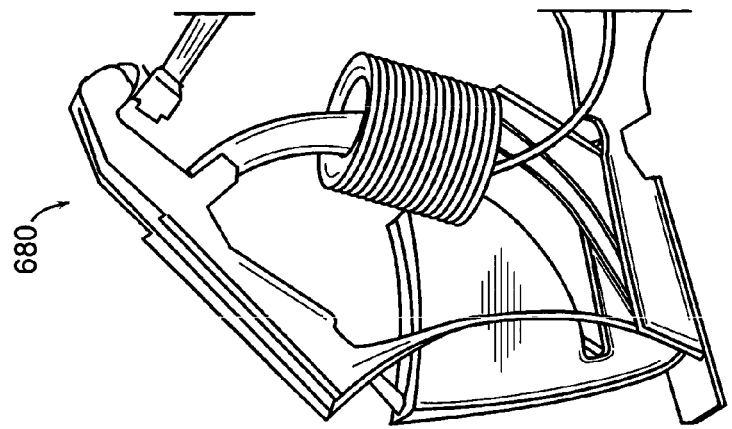
FIGS. 18A1-A4, 18B, and 18C illustrate preferred embodiments including bi-stable mechanisms in parallel with an actuator in accordance with the present invention.
Figure 18B:
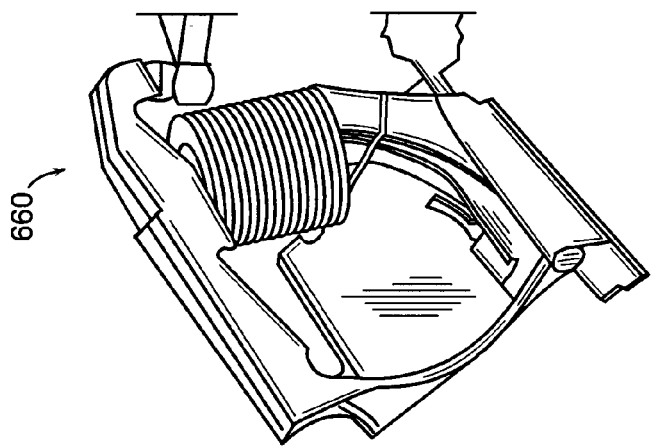
Figures 2, 18A:
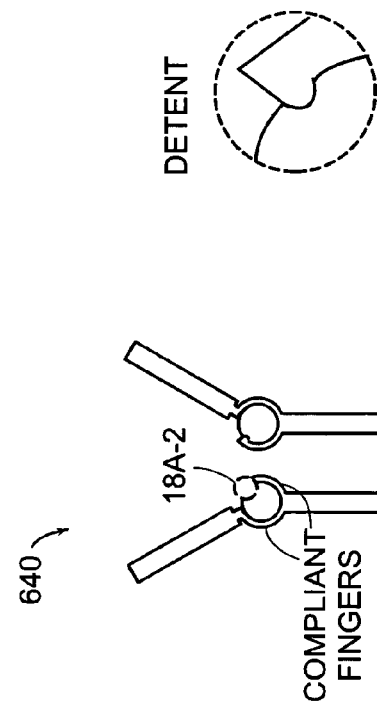
Figures 3, 4, 18A:
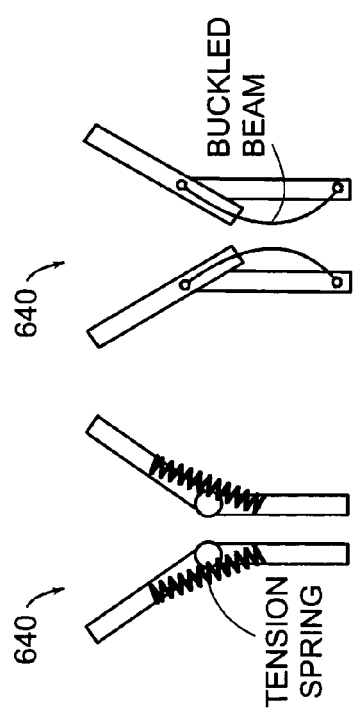
Figures 1, 18A:
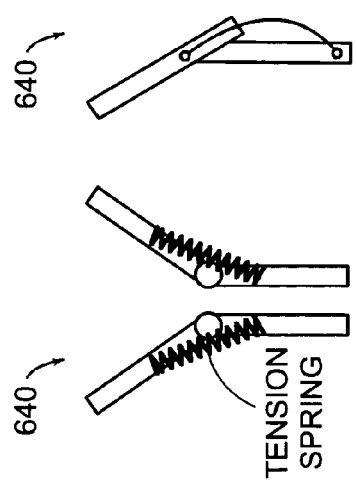

FIG. 4A shows an exploded view of the actuator module 140 with a plurality of the dielectric films 146 integrated into its flexible frame 142. Higher actuation forces can be achieved by increasing the number of layers of film sandwiched between the frames. When using an even number of dielectric films, the electrodes can be arranged so that the two outer electrodes are both grounded. The high voltage is only present in the inside of the actuator and is thus shielded from the environment. The actuator in this preferred embodiment uses two layers of the dielectric polymer as shown in FIGS. 4A and 4B.

Figure 5:
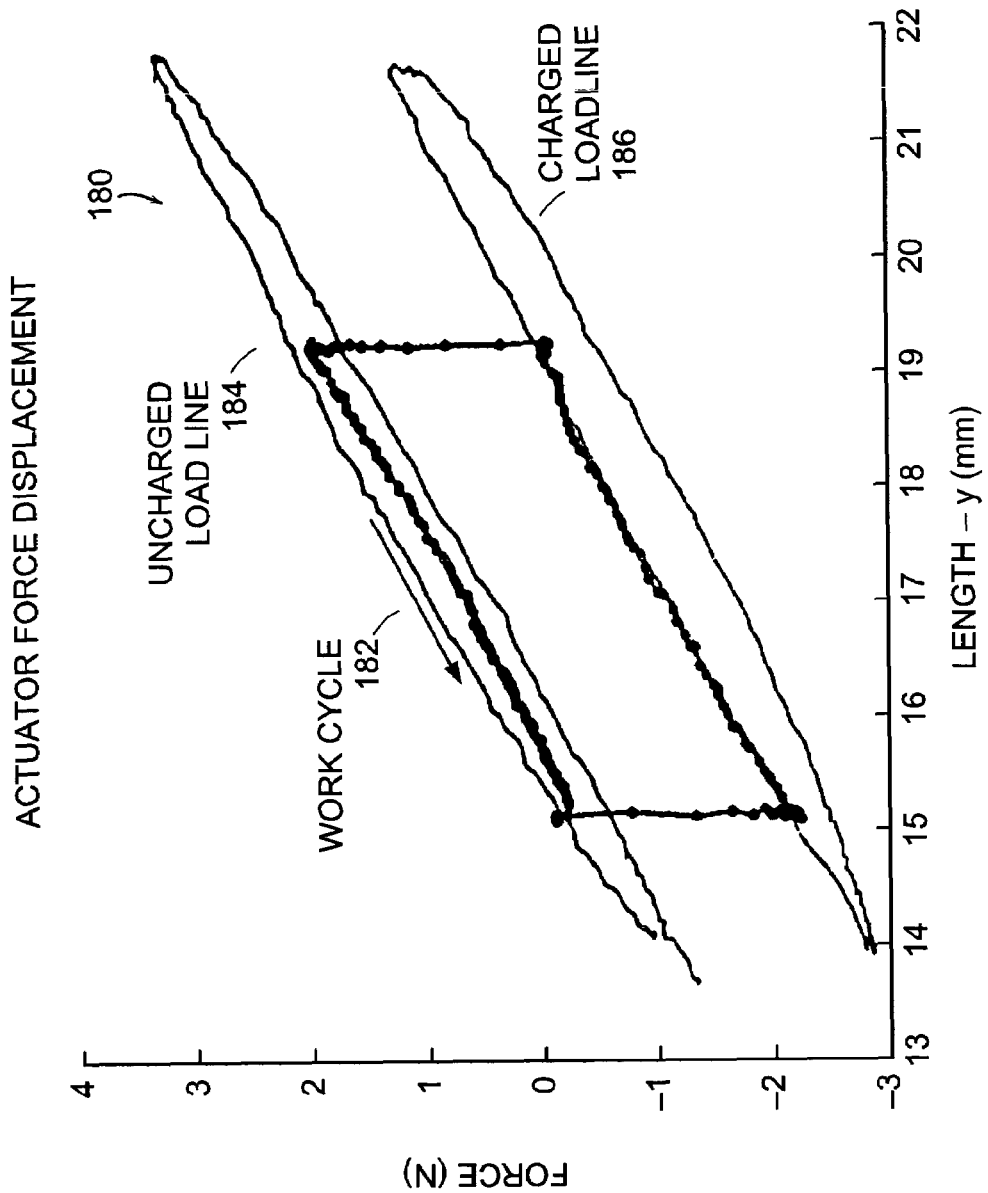
FIG. 5 graphically illustrates the performance of the actuator in terms of the force-displacement characteristics in accordance with a preferred embodiment of the present invention.

To evaluate the performance of the actuator, the force-displacement characteristics are measured and graphically illustrated in FIG. 5. Curves are shown for an actuator with 0 kV, 5.5 kV, and completing a work cycle 182. The work cycle is generated by constraining the displacement of the actuator. A voltage of 5.5 kV is applied and the force applied to the constraint is recorded. While keeping the voltage fixed, the constraint is moved until the actuator force is zero. The voltage is then removed and the process is repeated. The area enclosed by a counter-clockwise work cycle corresponds to the work output per cycle.

The slope of the curve, which corresponds to the stiffness of the actuator, is nearly constant at 0.5 N/mm for the range shown. Some hysteresis is evident, which is attributed to the viscoelastic losses of the film and frame. As shown in FIG. 5, changing the voltage from 0 to 5.5 kV offsets the curve, but does not significantly change its slope, suggesting that the stiffness of the actuator is independent of the state of actuation over the range shown. The actuator can therefore be modeled as a spring 200 that changes its undeformed length upon actuation while maintaining its stiffness, as shown in FIG. 6A. The corresponding force-displacement curves 240 are shown in FIG. 6B.

Figure 6B:
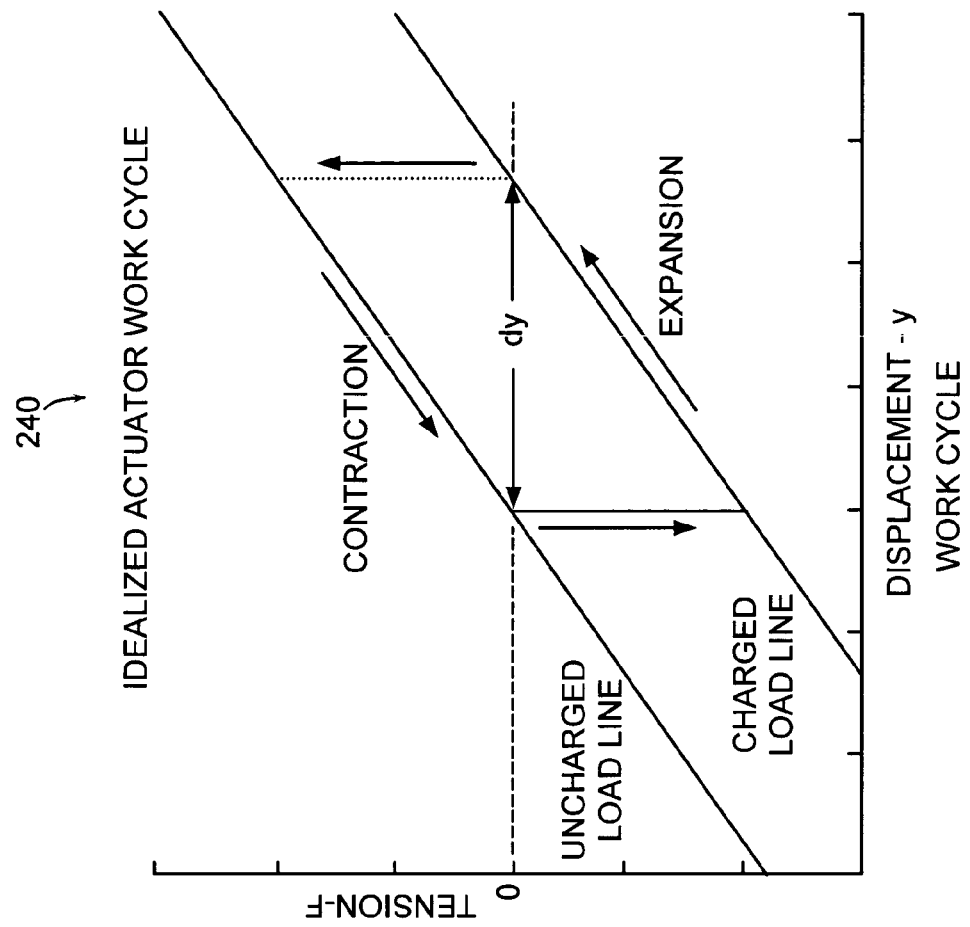
FIGS. 6A and 6B illustrate a model of the actuator as a spring that changes its undeformed length upon actuation and corresponding force-displacement curves in accordance with preferred embodiments of the present invention.
Figure 6A:
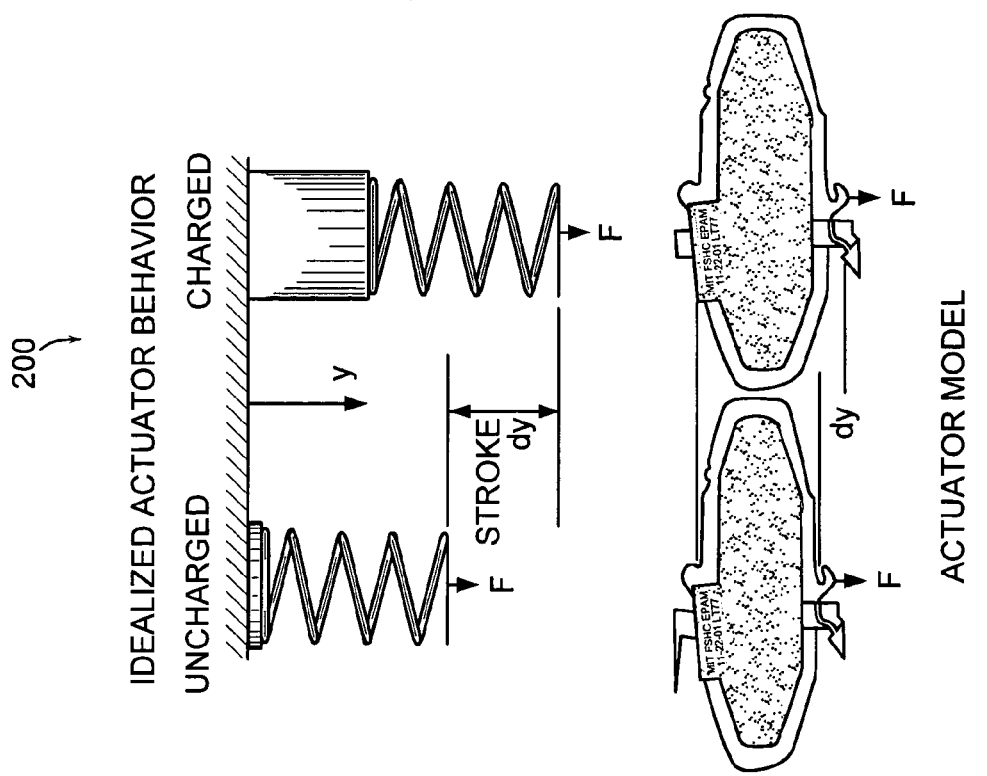

In FIG. 6B it can be seen that the vertical separation between the charged and uncharged stiffness curves represents the force differential the actuator can achieve if rigidly constrained. The horizontal separation of the curves at a given force corresponds to the actuator stroke, which is independent of external loading, provided the load remains constant throughout the stroke. Due to the compliance of the actuator, its length changes with external loading. The force generated by the actuator is not constant throughout the stroke. The force reaches its maximum at the beginning and linearly decreases to zero at the end of the stroke. However, for most applications including the BRAID, an actuator that provides uniform force is more desirable. Such actuator performance can be achieved by tuning the force displacement profiles in FIG. 6B with a passive element.

FIGS. 7A and 7B show a linear bi-stable element (LBE) and its corresponding force-displacement characteristics. The LBE consists of a base 266 that elastically supports two opposing flexure arms 262. As a slightly oversized insert 264 is placed between the arms, it pre-loads the base and causes the assembly to have two stable configurations. Between these bi-stable states, there is a region where the force-displacement curve is approximately linear and has a negative slope, as shown in FIG. 7B. The slope is a function of the geometry and material of the LBE. By varying the width of the insert, the slope of the force-displacement curve in the near-linear region can be tuned precisely. The stiffness of the actuator and LBE in parallel is equivalent to the sum of the actuator stiffness and LBE stiffness. Thus, by designing a LBE with a slope of negative 0.5 N/mm over its linear range, the combined actuator module can be tuned to have zero stiffness (constant force output) over an operating range.

FIG. 8A shows the force displacement characteristics 300 of the combined actuator module including the passive element. The work cycle measurements presented in FIG. 5 were repeated. FIG. 8A shows a range over which the actuator force is approximately constant. Comparing the work cycles in FIG. 5 and FIG. 8A, the advantages of the compensated actuator become evident. The stroke of the actuator is increased from about 4 mm to 8 mm.

By using mechanical stops the actuator motion can be confined to the zero-stiffness range. Such an actuator has uniform force-displacement characteristics and reaches the same endpoints regardless of loading, provided it is within actuator capability. Thus, such an actuator module provides robust binary operation. By using the actuator in a binary fashion, the hysteresis introduced by the viscoelastic properties of the elastomer is no longer a concern.

FIGS. 8B and 8C graphically illustrate the displacement 320 and current 340 of the actuator versus time. Most of the current is drawn as the actuator charges. Some leakage current is drawn once the actuated state is reached. If the dielectric elastomer actuator behaved as a true capacitor, there would be no current drawn at steady state. The actuator is switched off by draining the charge through a resistor. Theoretically, this energy can be recovered by circuitry and returned to an energy storage device such as a battery. While the voltage required for actuation is very high (5.5 kV), the current drawn is extremely low. The peak current for the given actuator is about 0.03 mA, which corresponds to a maximum electrical input of 0.165 W.

FIGS. 9A and 9B show the actuator in its two states. The actuation force is about 1.5 N. The actuator stroke is about 8 mm, with the polymer film undergoing a strain of about 57%. The weight of a complete actuator unit is approximately 6 grams. Most of this weight is due to the frame and bi-stable element. For a double-layered actuator, the weight of the dielectric elastomer and electrodes itself is less than 0.1 grams, only a fraction of what force the actuator is capable of providing.

The range of motion of the actuator can be further increased in another embodiment by including passive elements that have the desired negative stiffness over a larger range. The stroke of the current prototype is limited by the range of the LBE, rather than by the film or frame.

When the actuators are implemented into the BRAID, they behave as structural elements with embedded actuation. Three parallel actuators form a single stage. A combination of identical stages forms the BRAID. The binary actuators and in particular the BRAID is a primarily all-plastic, lightweight, binary manipulator.

FIG. 10 shows a view of a single BRAID stage before the dielectric elastomer actuators are integrated. The kinematics of the mechanism requires a revolute joint 404 at the bottom of the actuator and a spherical joint 402 at the top. One rotational DOF is provided by a cross-flexural hinge machined from Delrin®. The hinge at the top of the frame approximates a spherical joint for small motions. It consists of a thin compliant leaf that connects two pointed stiff elements.

Figure 11A:
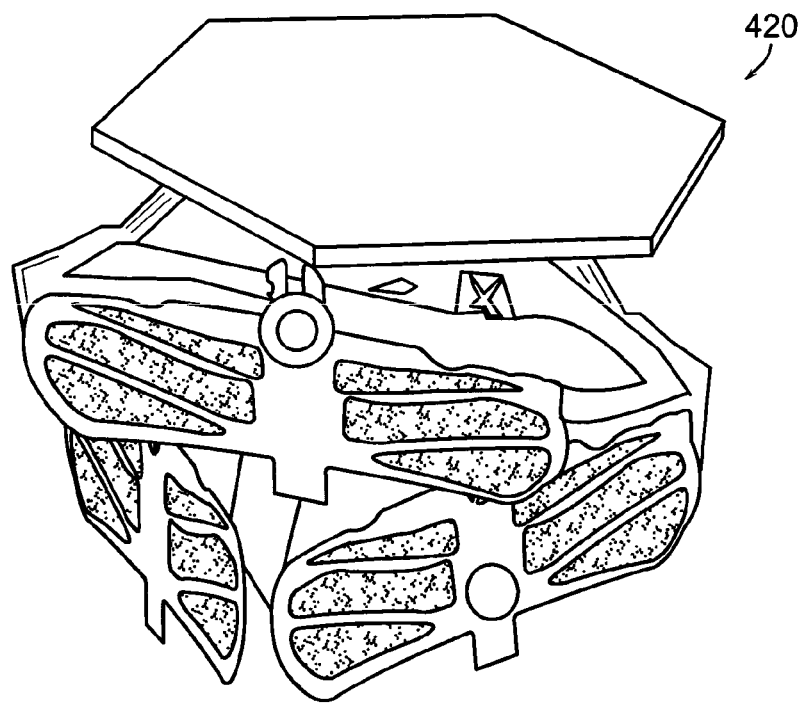
FIGS. 11A and 11B illustrate a two-stage binary actuated device manipulating an object, for example, a mirror, in accordance with a preferred embodiment of the present invention.
Figure 11B:
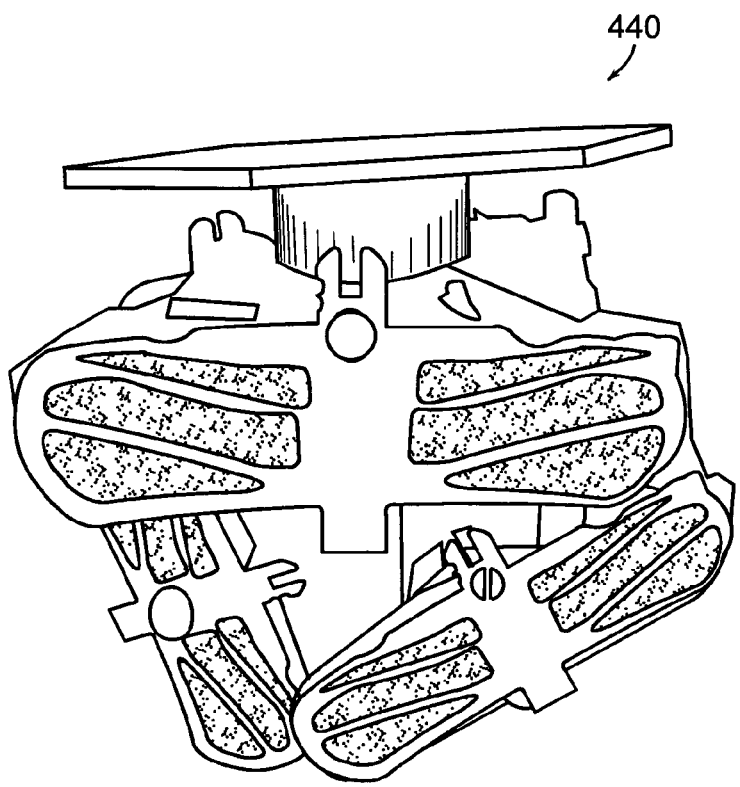

FIGS. 11A and 11B show a two-stage BRAID prototype manipulating a mirror. It has six binary DOF, allowing $2^6=64$ discrete states. Each degree of freedom is controlled by a simple switch. The total weight of the two-stage BRAID prototype is about 65 grams. The weight of the active actuator material itself, i.e. the dielectric film and electrodes, accounts for only 1% of the total weight. This suggests that most of the weight savings can be achieved by optimizing the structure rather than the actuators themselves. The performance of the BRAID presented here is sufficient to manipulate a small camera.

Dielectric elastomer artificial muscles have been introduced into the field of high-DOF binary robotics. The performance of these actuators shows promise of making high-DOF binary robotic systems practical. Preferred embodiments of the present invention include implementing dielectric elastomer actuators to perform mechanical work. A preferred embodiment includes embedding the elastomer actuators into flexible frames which maintains the desired boundary conditions on the actuator film and results in the performance of mechanical work. By adding a passive element, a self-contained actuator module is formed that can work both under tension and compression and produces approximately uniform force throughout the stroke. The active actuator area achieves a relative strain of 57% and provides a force of 1.5 N, while weighing 6 grams. The two-stage BRAID device illustrates that these actuators are a feasible alternative to conventional technologies. The simplicity of the actuators allows for high DOF binary system devices that are virtually all-plastic, inexpensive, lightweight, and easy to control devices.

A preferred embodiment of the present invention includes binary elastomeric actuated robots for space robotic systems. These robots include simple binary actuators for binary operations as described herein, have a compact polymer structure, and compliant, bi-stable mechanisms such as, for example, devices including detents. The detents achieve binary actuation due to the creation of sliding surfaces. FIGS. 12A-12D illustrate applications for space robots including the binary elastomer actuators. The actuators of the preferred embodiment can be integrated into rovers, satellites and constructions devices.

Figure 13:
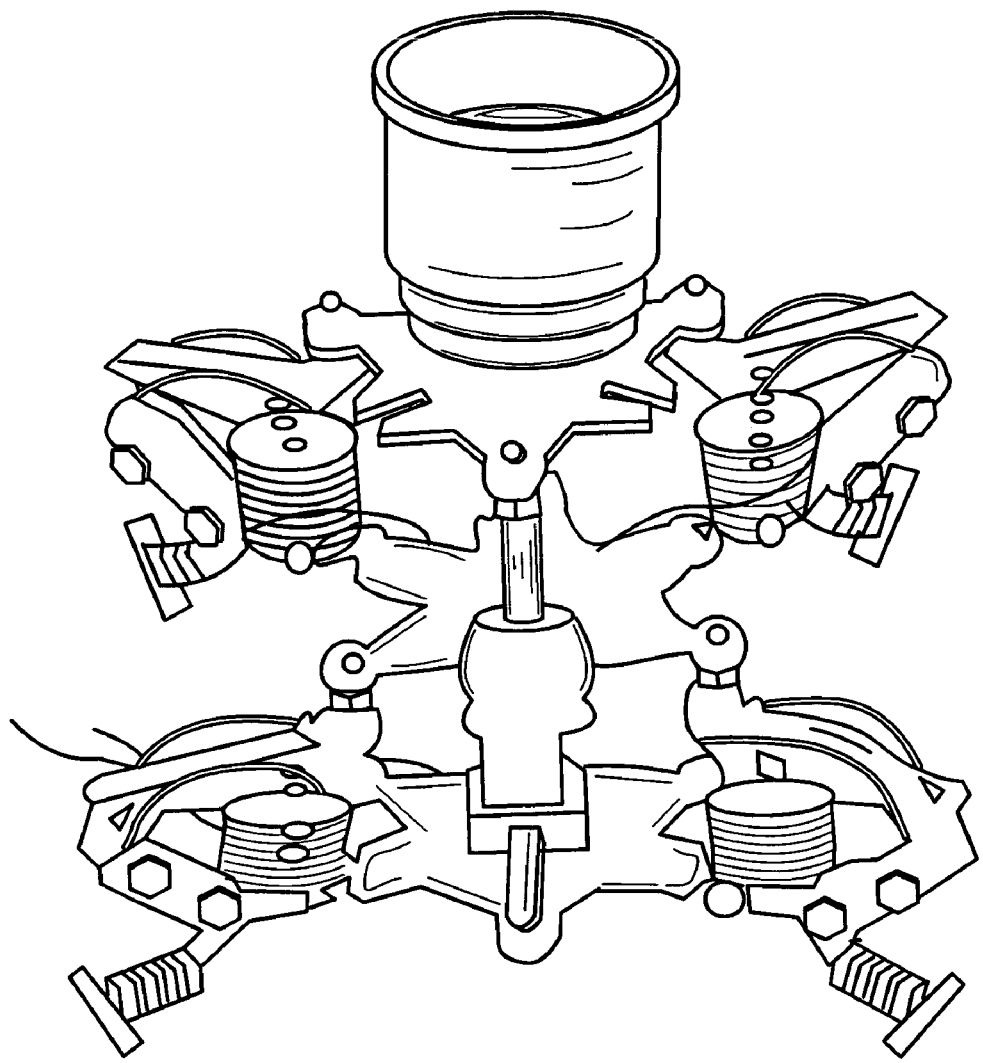
FIG. 13 illustrates an embodiment of an electromagnetic actuator device.
Figure 14B:
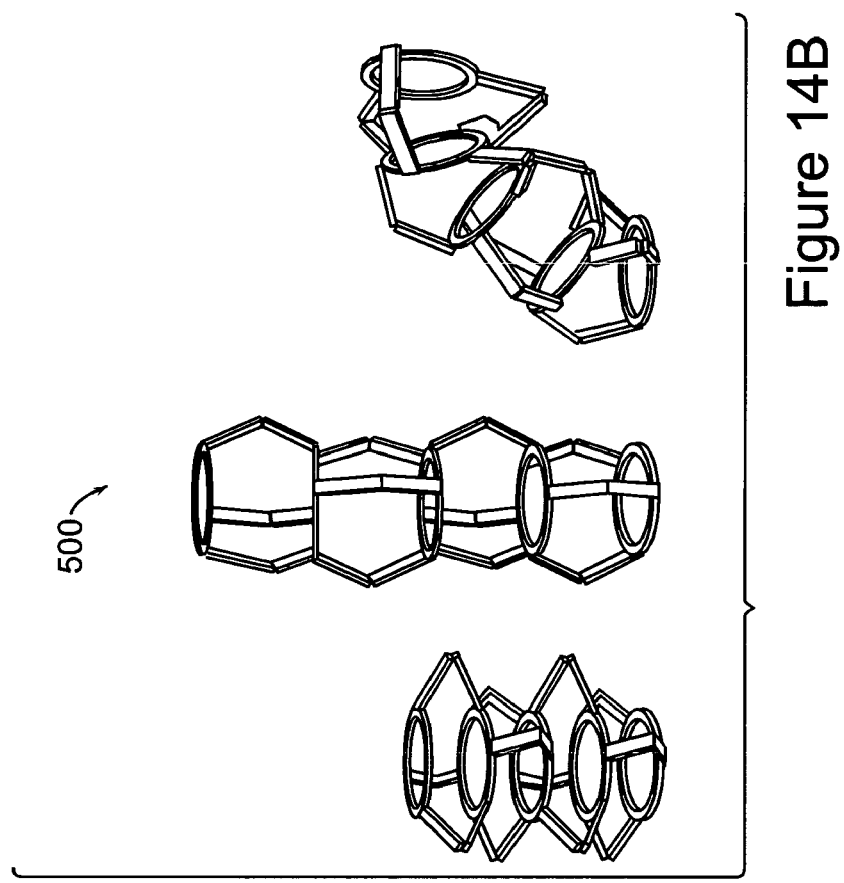
FIGS. 14A and 14B schematically illustrate a binary robotic articulated device having a serial stack of parallel stages, in accordance with a preferred embodiment of the present invention.
Figure 14A:
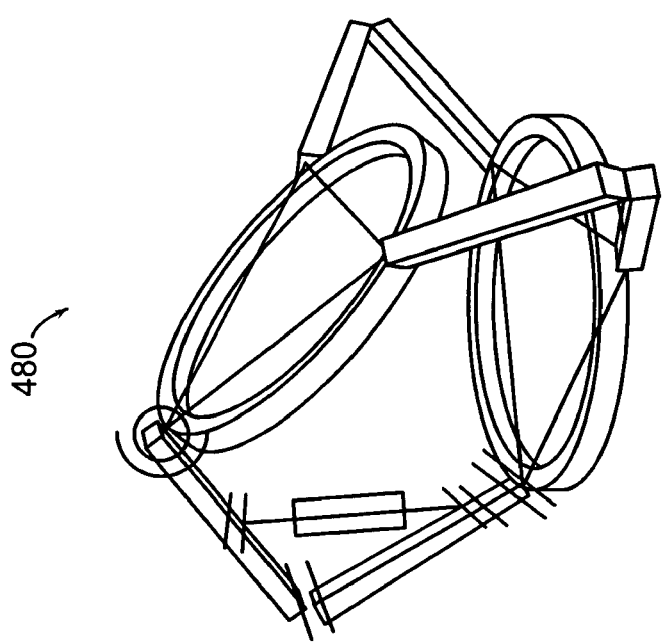

FIGS. 14A and 14B schematically illustrate a binary robotic articulated device having a serial stack of parallel stages, each having three binary actuators in accordance with a preferred embodiment of the present invention. FIG. 13 illustrates an embodiment of an electromagnetic actuator device.

FIGS. 15A and 15B illustrate the system architecture of a device having at least an electromagnetic actuator in combination with an elastomeric actuator. The device includes bi-stable detent mechanisms 522, flexural bearings 526 and a preload magnet 528. The elastomer actuator can be used in parallel with the electromagnetic actuator and functions as an element that assists in actuation.

Figure 16B:
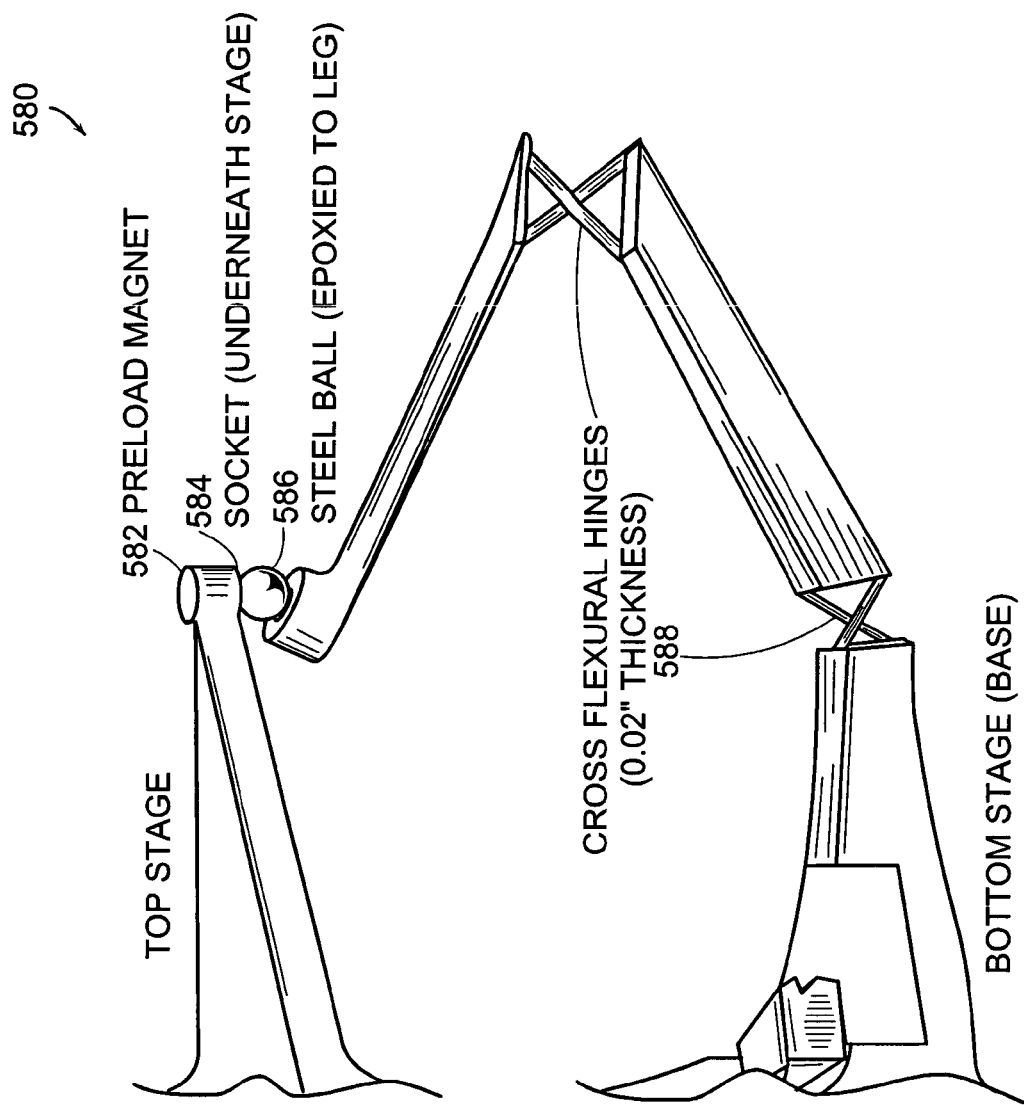
FIGS. 16A and 16B illustrate a preferred embodiment of compliant bearings having electromagnetic actuators that can have elastomeric actuators in combination therewith in accordance with the present invention.
Figure 16A:
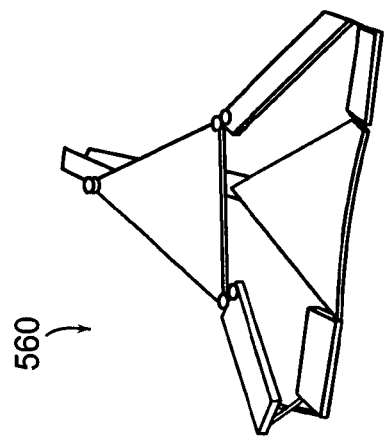

FIGS. 16A and 16B illustrate a preferred embodiment of compliant bearings having electromagnetic actuators in accordance with the present invention. The ball 586 and socket 584 provide spherical joint. The ball-socket joint introduces moving parts into the device. In a preferred embodiment, the compliant bearings can have elastomeric actuators in combination with electromagnetic actuators.

Figure 17B:
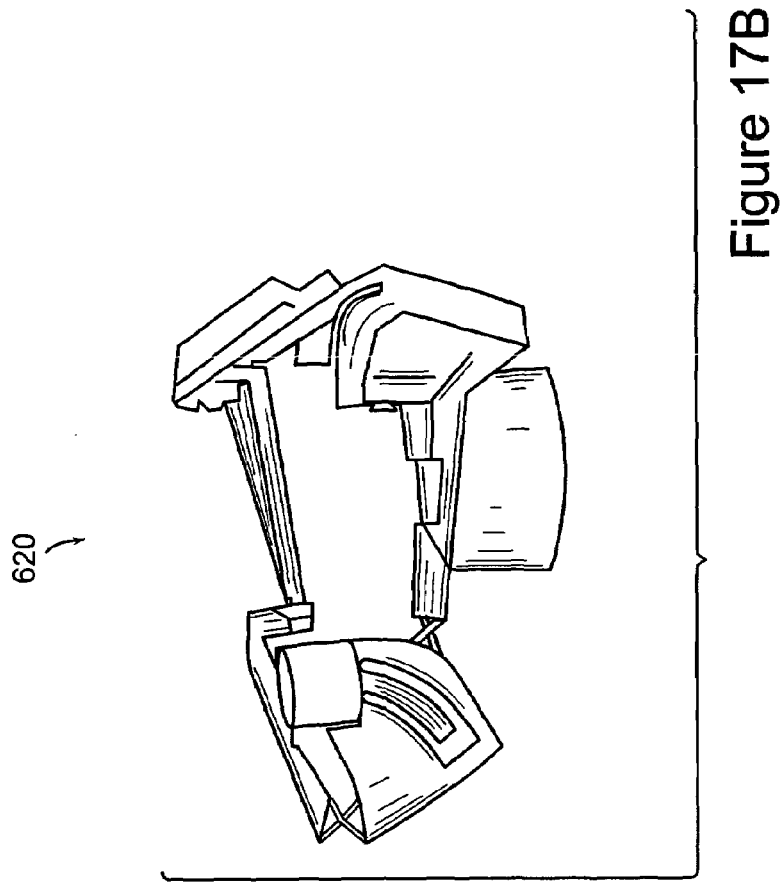
FIGS. 17A and 17B illustrate a preferred embodiment of electromagnetic actuators that can have elastomeric actuators combined therewith in accordance with the present invention.
Figure 17A:
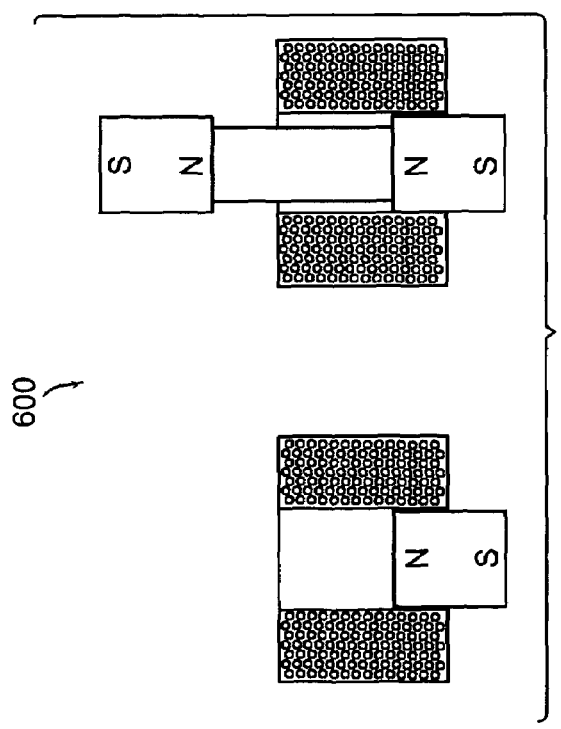

FIGS. 17A and 17B illustrate a preferred embodiment of electromagnetic actuators. Solenoids 600 can be used in a push-pull configuration. The solenoid actuators can include multiple stages, for example, two stages. A preferred embodiment can include elastomeric actuators in combination with the solenoid actuators to actuate various mechanical systems.

FIGS. 18A-18C illustrate preferred embodiments of the present invention including bi-stable mechanisms in parallel with an actuator. These embodiments maintain binary configurations without actuator power which is important in many applications such as space systems applications. FIGS. 19A-19C further illustrate embodiments of devices having bi-stable mechanisms in accordance with the present invention.

A preferred embodiment of the present invention includes an artificial muscle actuator for various robotic systems. An assembly of the preferred embodiment allows electrostrictive polymer artificial muscles (EPAMs), or dielectric elastomer actuators to effectively and easily be implemented in practical applications. The operating principle of the EPAM assembly is shown and discussed hereinbefore with respect to FIGS. 2A and 2B. An elastomeric film 62 is coated on both sides with compliant electrodes 64. The compliant electrodes is made from a group including essentially, but not limited to, graphite, carbon, conductive polymers and thin metal films. As a voltage is applied across the electrodes, the electrostatic charges will force the film 62 to compress in thickness and expand in area. This expansion in area can be used to actuate various mechanical systems.

In an embodiment, the film is under tension at all times, and therefore the dielectric elastomer actuator assembly cannot work under compression without an additional force. In another embodiment, the film is in combination with a frame and the actuator assembly can work under compression and tension, and can both push and pull.

The actuator frame both pre-stretches the film and provides a restoring force in an active direction. A restoring force is tuned with an additional passive element to provide a constant force throughout the stroke. The passive element can be tuned such that when two actuators are used as antagonistic pairs, they behave in a bi-stable fashion.

Figure 20:
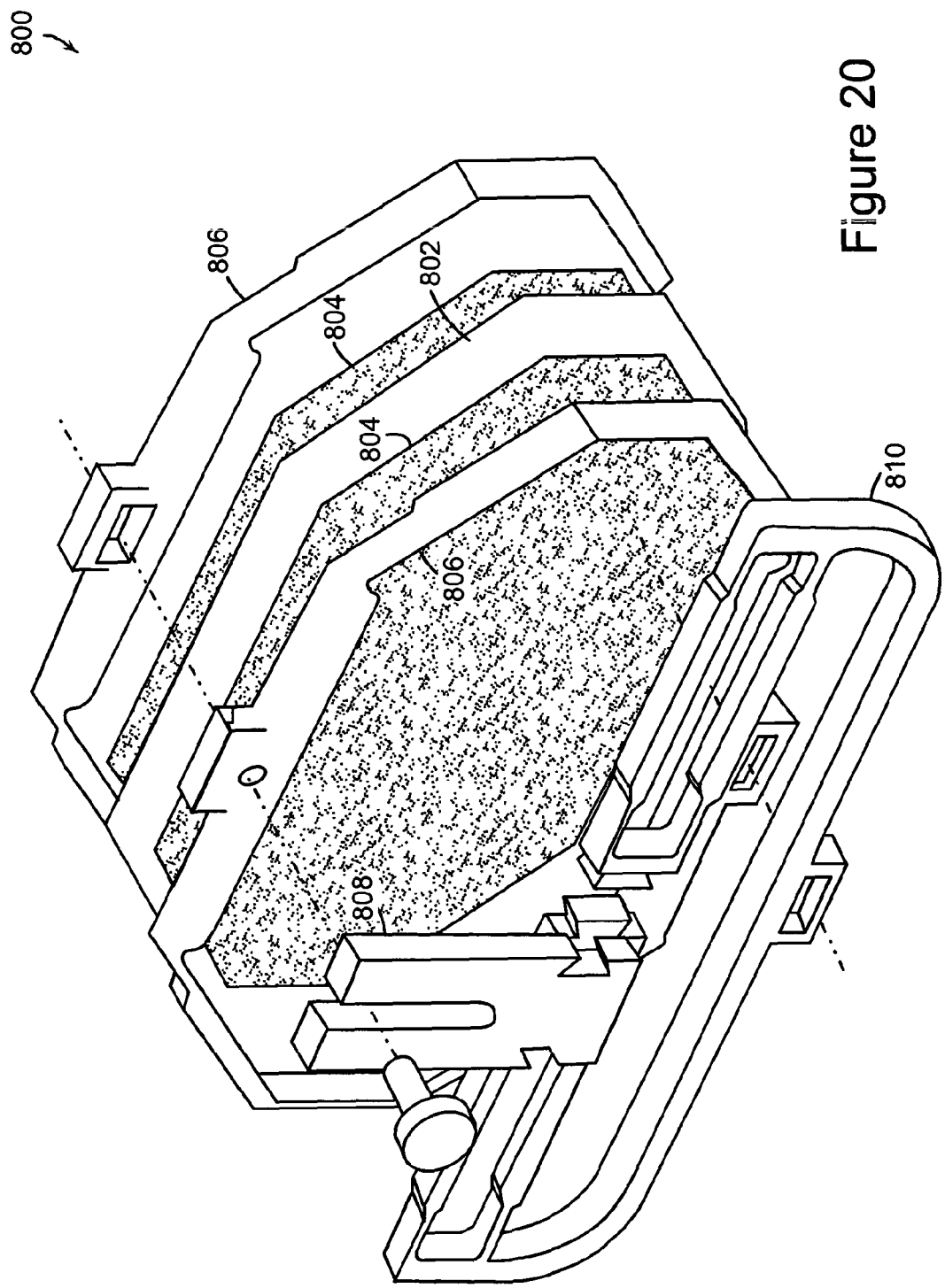
FIG. 20 is an exploded view of an actuator module in accordance with a preferred embodiment of the present invention.

FIG. 20 illustrates an exploded view of an actuator module in accordance with a preferred embodiment of the present invention. The actuator includes an elastomeric polymer film 802, compliant electrodes 804, a flexible frame 806, a passive element base 808 and a passive element insert 810 to preload passive element base 808.

The elastomeric polymer film 802 and the compliant electrodes 804 form the EPAM. The EPAM is stretched in both planar directions by being sandwiched between two flexible frames 804. These components 802, 804, 806 form an actuator that can both work under tension and compression, however the motion of the actuator is limited by the inherent stiffness of the film and frame. The passive element 808, 810 is connected in parallel with the actuator and effectively cancels the stiffness of the frame and film.

Figure 21B:
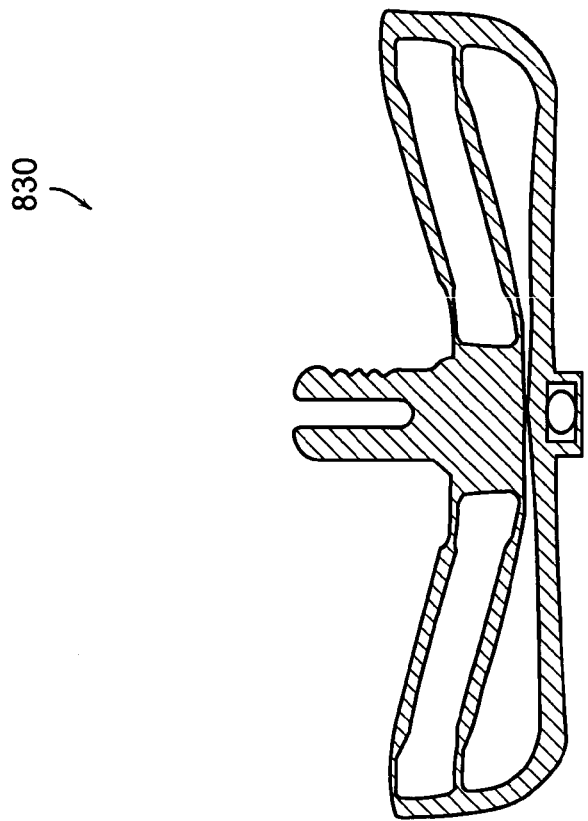
FIGS. 21A and 21B are views of the passive element illustrating two stable states of the actuator assembly in accordance with a preferred embodiment of the present invention.
Figure 21A:
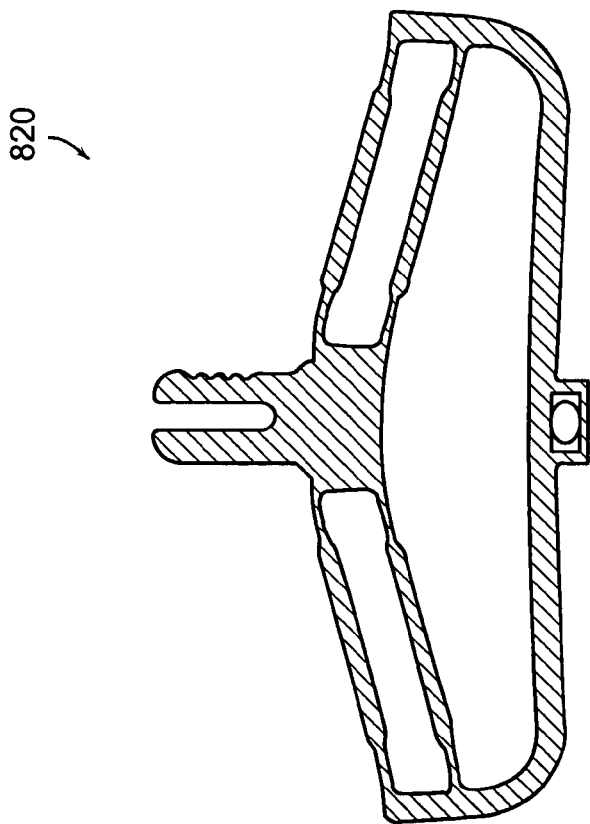

FIGS. 21A and 21B show the passive element in accordance with the present invention. It has two bi-stable states 820, 830. Between these two states there is a range where the force-displacement curve is negative, which cancels the positive force-displacement curve of the film and frame. This results in a self-contained dielectric elastomer actuator module that can both work under tension and compression (e.g. push and pull), and that produces a almost constant force throughout the actuator stroke.

Figure 22A:
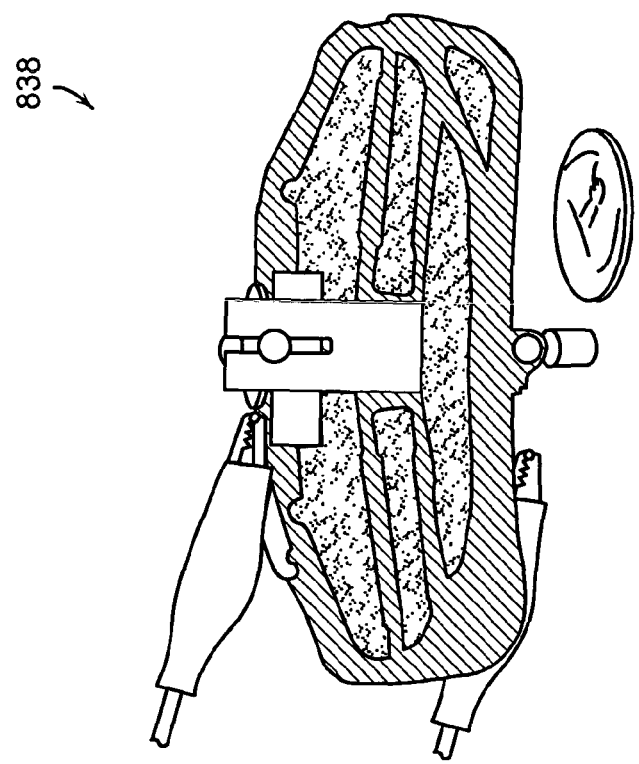
FIGS. 22A and 22B are views illustrating the actuator in its on and off positions in accordance with a preferred embodiment of the present invention.
Figure 22B:
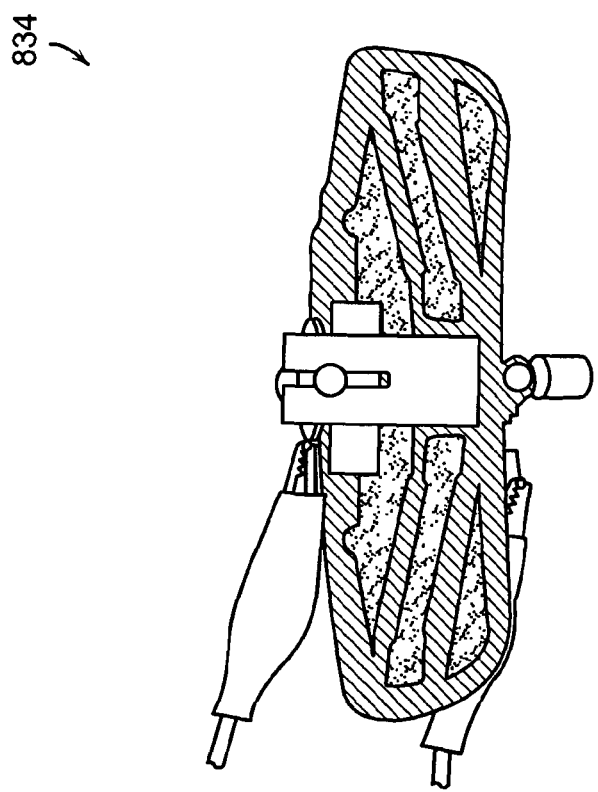

FIGS. 22A and 22B illustrate views of the actuator in its on and off positions in accordance with a preferred embodiment of the present invention. In a preferred embodiment, the dielectric elastomer actuator can achieve larger displacements. Another advantage of preferred embodiments includes an actuator with constant force throughout its stroke. Preferred embodiments can be used in robotic systems where conventional actuator technology is not feasible, for example, inside a magnetic resonance scanner. It can also be implemented in a surgical assist robot.

In a preferred embodiment, a flexible frame is a material that encloses a single or multiple sections of the elastomer film and serves one or both of the following functions. Deformation of the frame results in a change of the enclosed area. It pre-stretches the elastomer film in one or two planar directions. It also provides an elastic restoring force so that the actuator can work both under tension and compression. In an embodiment, the frame can be on just one or alternatively both sides of the elastomer film. It can also be directly embedded in the elastomeric film. A variety of geometries of frames meet the above functions.

Figure 23A:
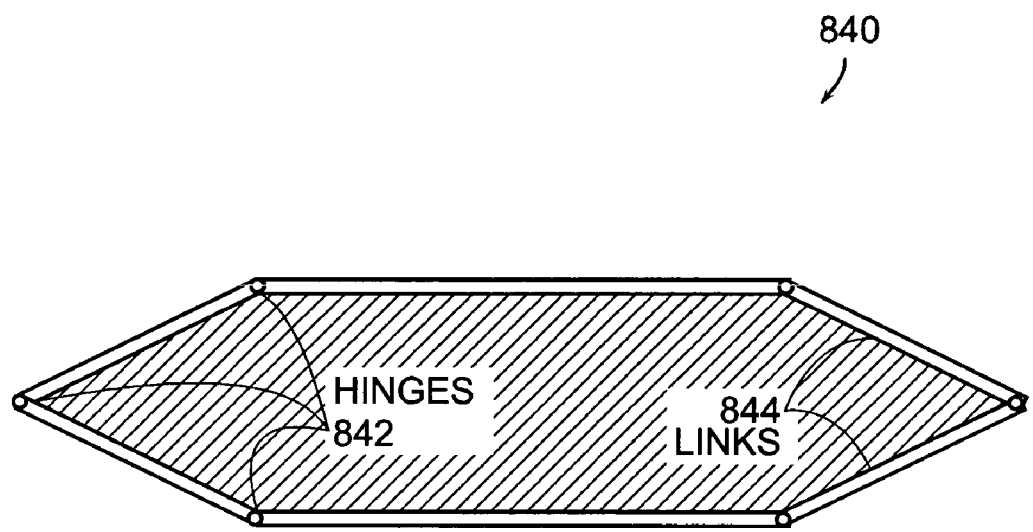
FIGS. 23A and 23B are schematic views of a hexagonal frame in accordance with a preferred embodiment of the present invention.
Figure 23B:
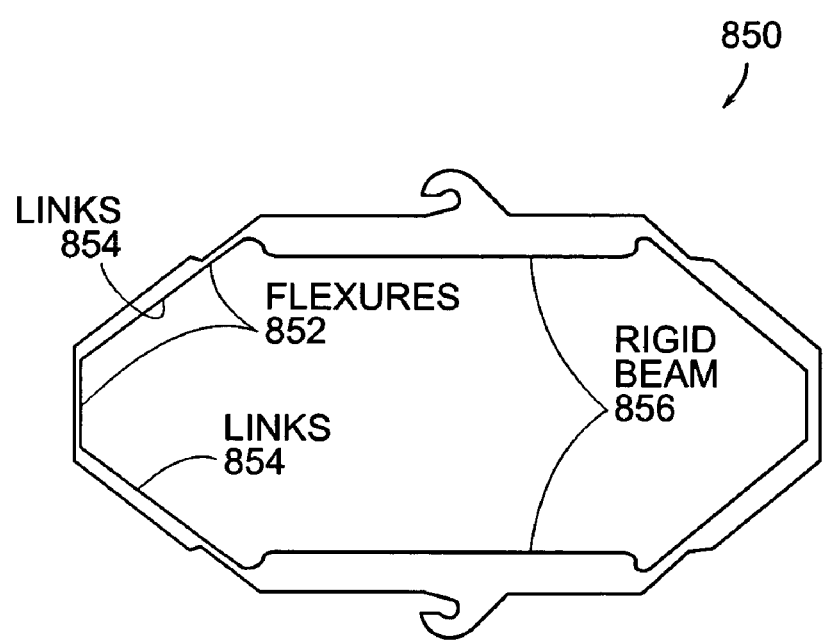

FIGS. 23A and 23B are views illustrating a hexagonal frame in accordance with a preferred embodiment of the present invention. In this embodiment, the frame can consist of two parallel beams that are connected by two pairs of links 844. The parallel beams move apart upon actuation.

Figure 24:
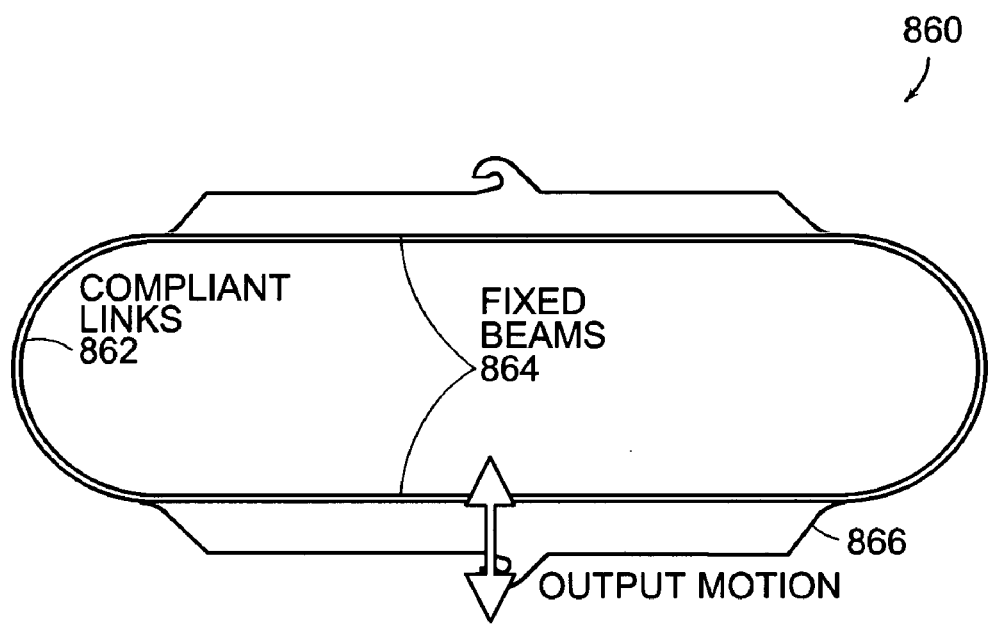
FIG. 24 is a preferred embodiment of a frame with compliant sides, essentially parallel beams with a continuous border, in accordance with the present invention.

FIG. 24 is a preferred embodiment of a frame with compliant sides in accordance with the present invention. This embodiment is similar to the one described hereinbefore, except that the links connecting the beams have been replaced by two continuous compliant members 862.

Figure 25:
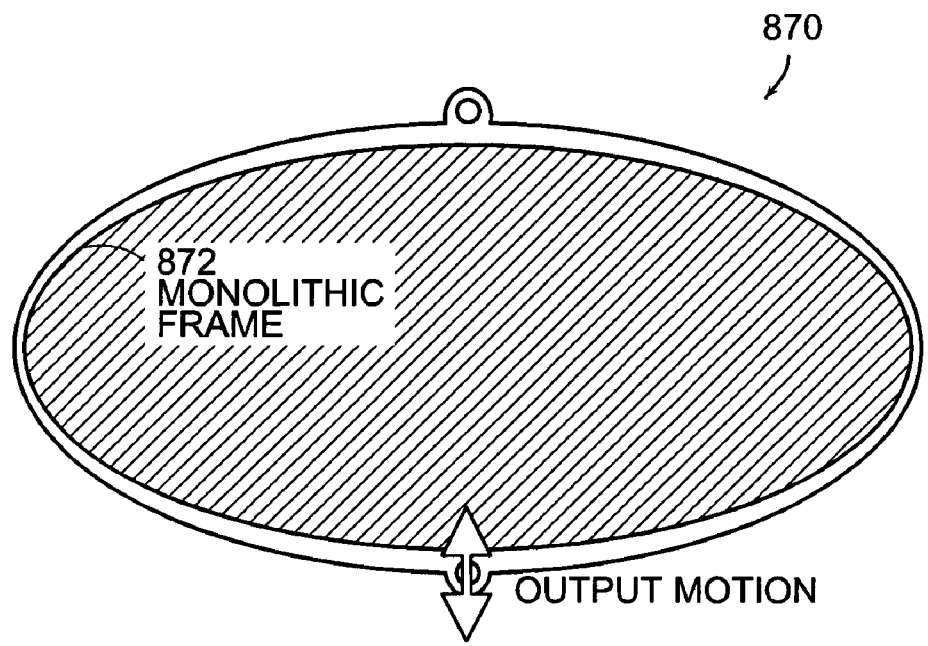
FIG. 25 is a preferred embodiment of a monolithic frame in accordance with the present invention.

FIG. 25 is a preferred embodiment of a monolithic frame in accordance with the present invention. In this embodiment all parts of the frame are flexible replacing the need for parallel beams.

Figure 26B:
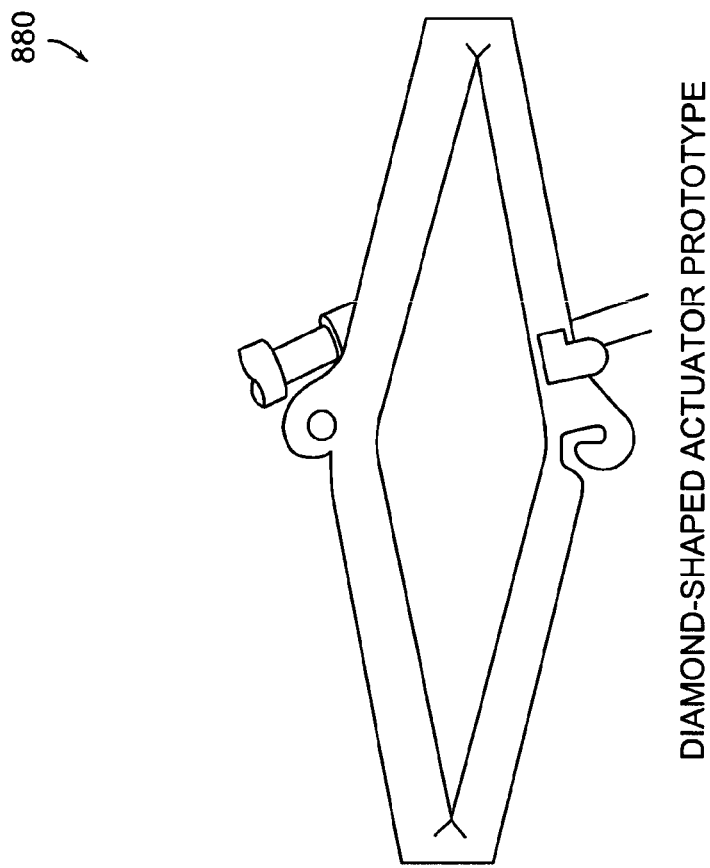
FIGS. 26A and 26B illustrate a diamond-shaped frame in accordance with a preferred embodiment of the present invention.
Figure 26A:
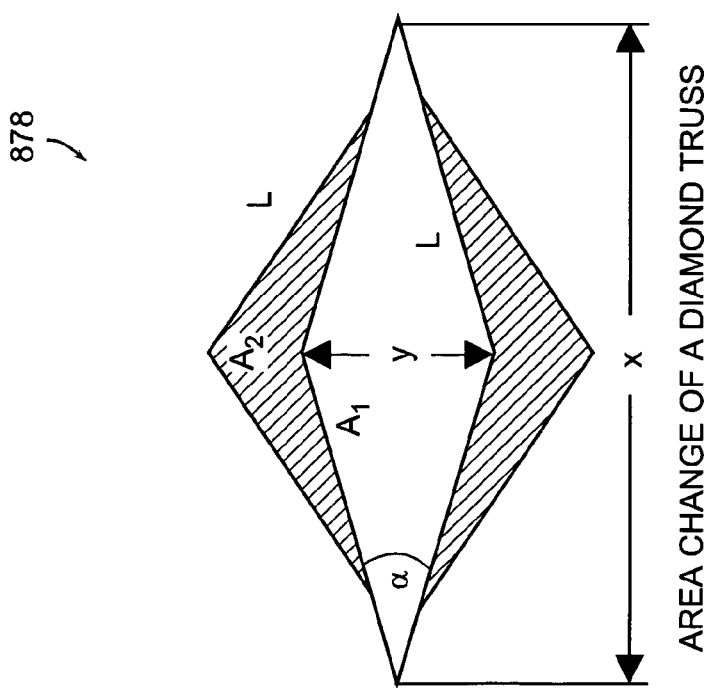
Figure 27A:
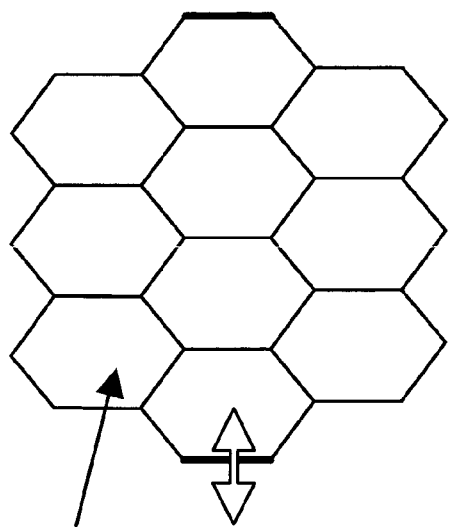
FIGS. 27A and 27B illustrate embodiments including multiple frames in accordance with preferred embodiments of the present invention.
Figure 27B:
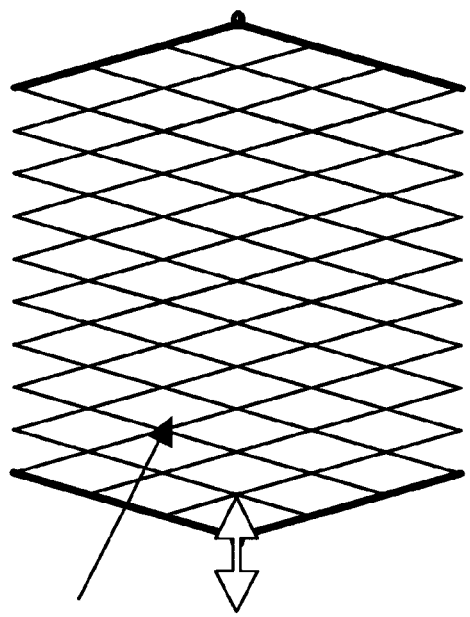

FIGS. 26A and 26B illustrate a frame having four links, forming a diamond. In another preferred embodiment, as illustrated in FIGS. 27A and 27B, a number of frames are combined, and are all actuated uniformly or separately. In FIG. 27A multiple hexagonal-shaped frames are combined while in FIG. 27B multiple flexible diamond-shaped frames are combined.

In a preferred embodiment, a large number of dielectric elastomer actuators can be used to build practical binary actuators. A binary actuator is an actuator that has two stable states. Since either state can be achieved accurately and repeatably, such an actuator is fault tolerant. As many binary actuators are combined their performance approaches that of a conventional continuous actuator. Due to their simplicity and high energy to weight ratio, dielectric elastomer actuators can be used to power a binary system with many actuators. The embodiments including linear dielectric elastomer actuators can be used to perform a variety of tasks, for example, in a magnetic resonance scanner.

Figure 28A:
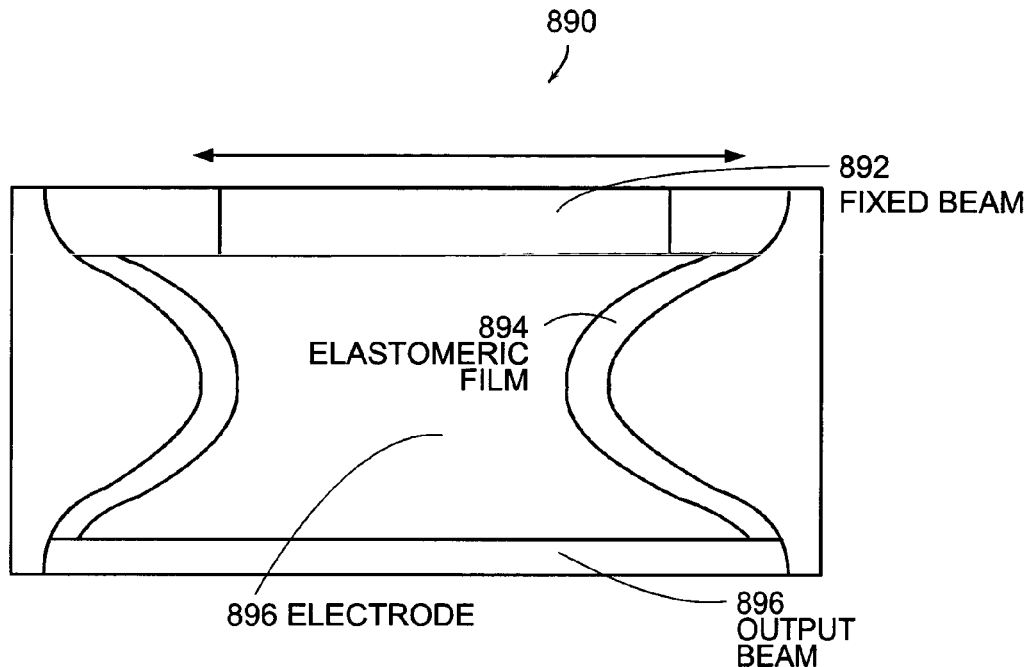
FIGS. 28A and 28B illustrate preferred embodiments of a parallel beam actuator in accordance with the present invention.
Figure 28B:
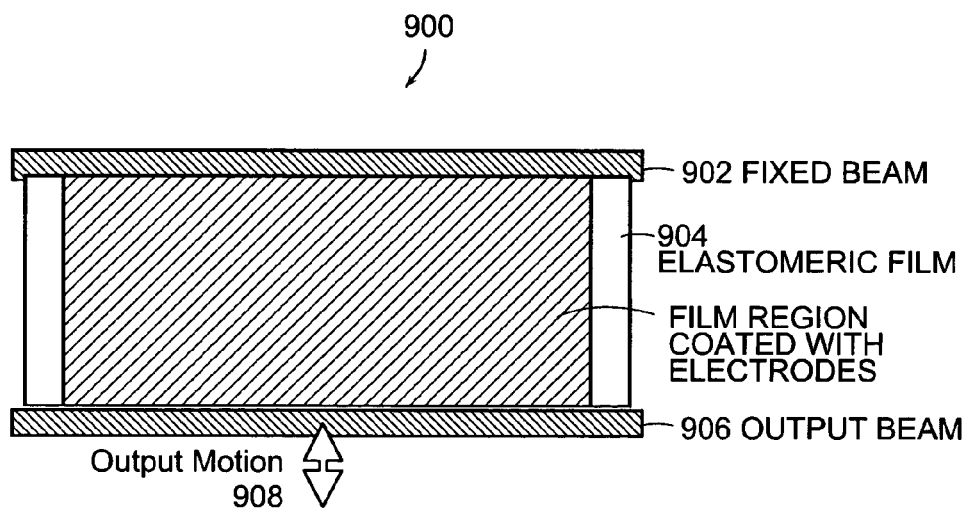

FIGS. 28A and 28B illustrate preferred embodiments of a parallel beam actuator in accordance with the present invention. In this embodiment an elastomeric film 894, 904 is attached to two parallel beams. The elastomeric film is coated on both sides with compliant electrodes 896. Applying a voltage across the electrodes causes the film to expand in area, allowing the two beams to separate. This principle can be used for actuation in mechanical systems.

Figure 29B:
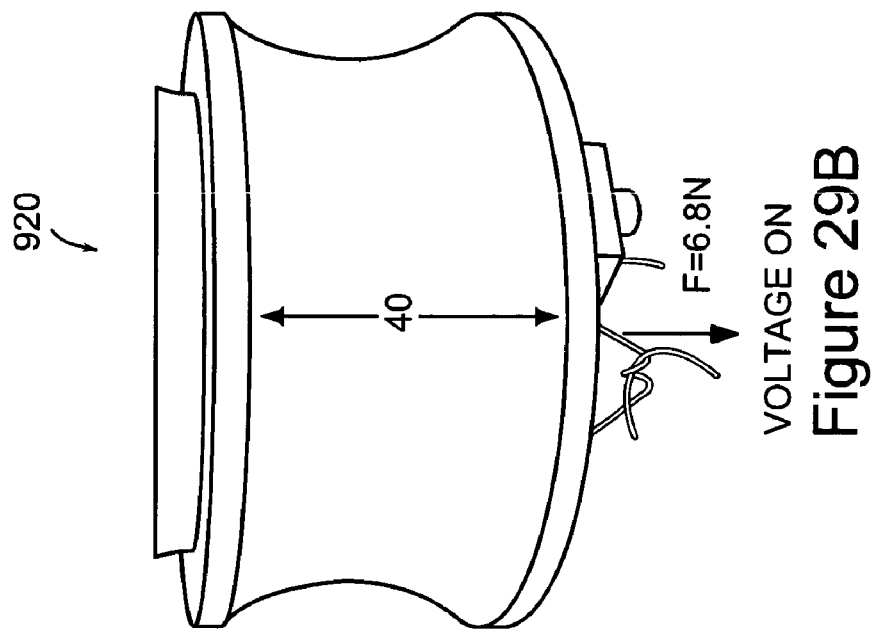
FIGS. 29A-29C illustrate preferred embodiments including cylindrical actuators in accordance with the present invention.
Figure 29A:
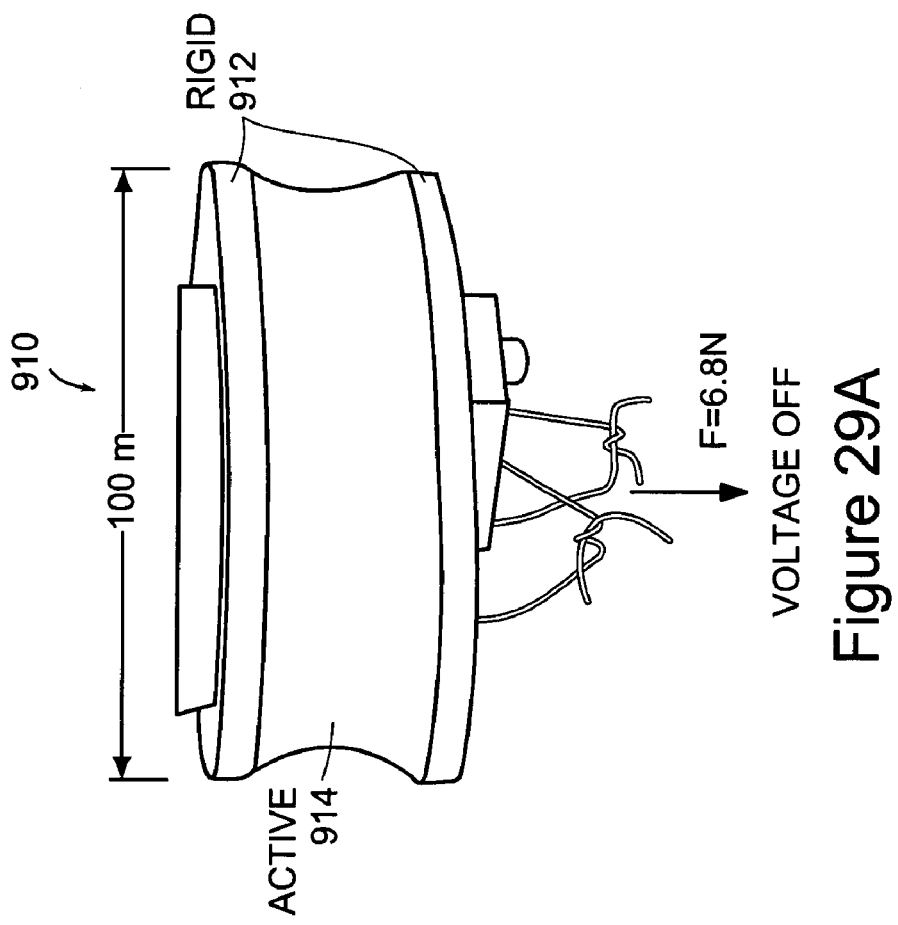
Figure 29C:
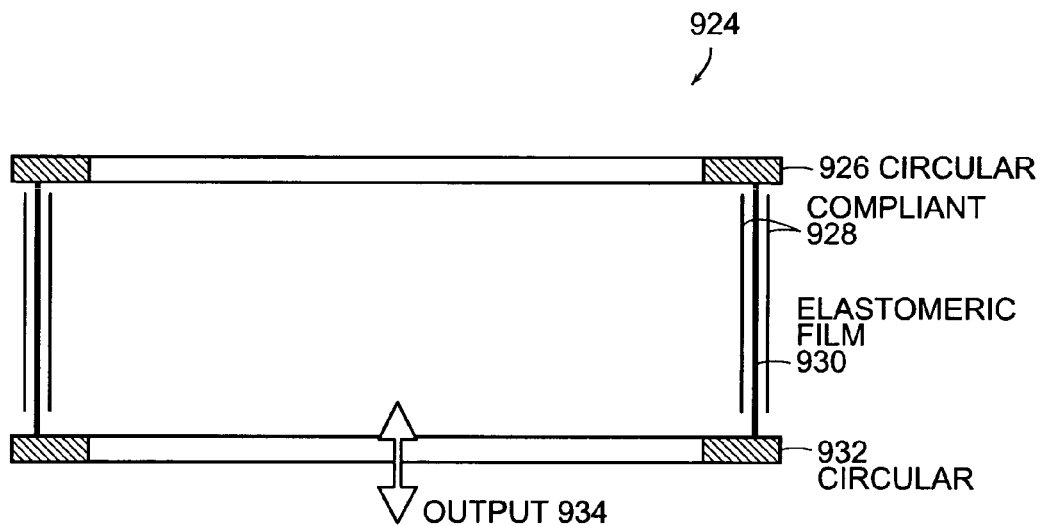

FIGS. 29A-29C illustrate preferred embodiments including cylindrical actuators in accordance with the present invention. A cylindrical actuator 910, 920 follows the same principle as the parallel beam actuator. The main difference is that a planar sheet of electrode-coated elastomeric film has been rolled into a tube. The top and bottom faces of the cylinder are rigid disks 912 or rings. The elastomeric film forms a cylindrical shell. Both the interior and exterior walls of the cylindrical wall are coated with compliant electrodes. Applying a voltage to across the electrodes allows the cylindrical shell to expand in length.

Figure 30C:
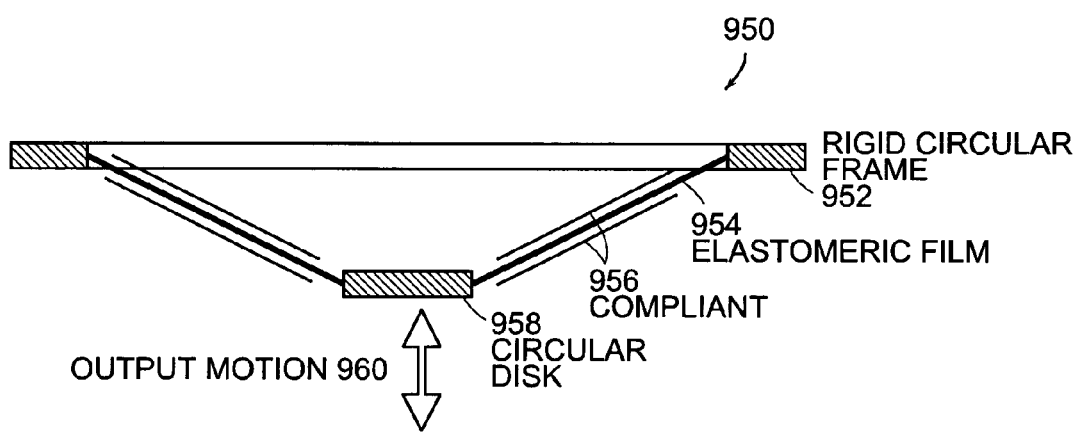
FIGS. 30A-30C illustrate diagrams and a cross-sectional view of a conical actuator in accordance with a preferred embodiment of the present invention.
Figure 30B:
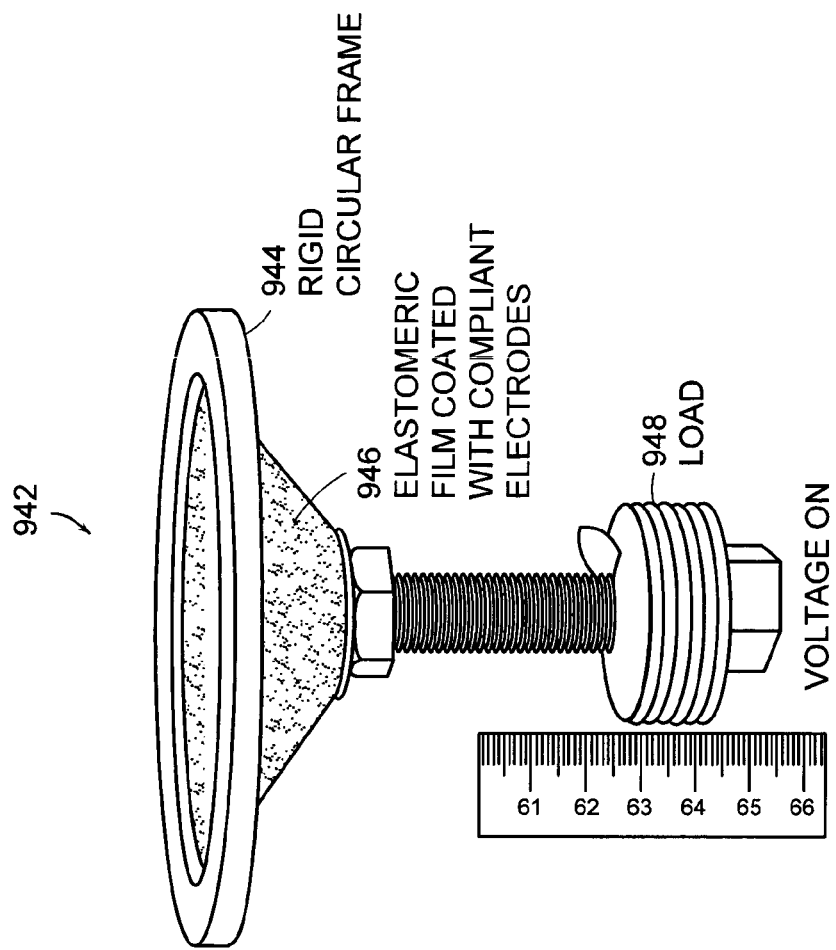
Figure 30A:
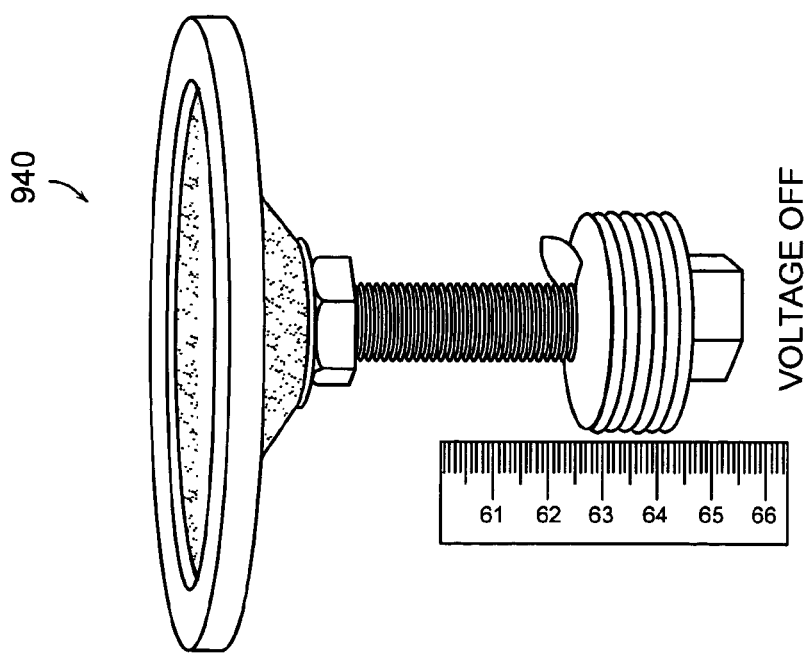

FIGS. 30A-30C illustrate a preferred embodiment including a conical actuator in accordance with the present invention. In this embodiment, the actuator has the shape of a truncated cone. The base of the cone consists of a rigid circular ring 944, 952. The elastomeric film 946, 954 forms a conical shell and is attached to the rigid ring at its base and to a rigid circular disk at its top. The inner and outer sides of the elastomeric film are coated with compliant electrodes 956. Applying a voltage across the electrodes allows the cone to expand in height, i.e., the rigid ring and disk are allowed to separate along the axial direction.

Figure 31:
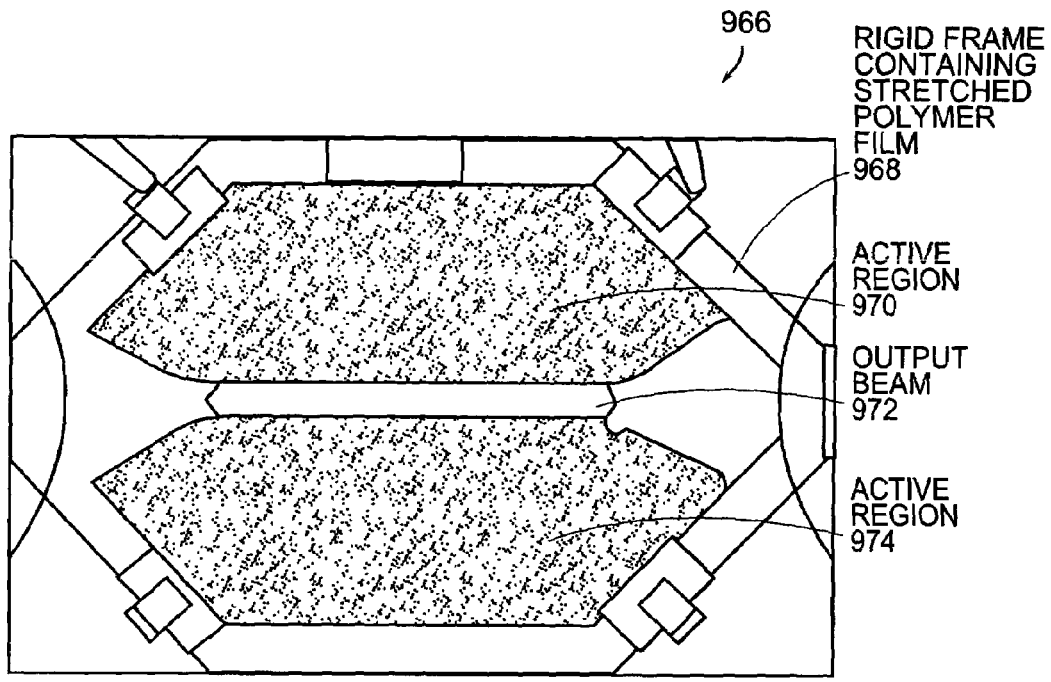
FIG. 31 illustrates a diagram of an actuator including an antagonistic pair in accordance with a preferred embodiment of the present invention.

FIG. 31 illustrates a preferred embodiment of a dielectric elastomer actuator having an antagonistic pair. All actuator embodiments described hereinbefore can further be combined with any of the other embodiments. For example, the actuators described can be combined with a ratcheting mechanism to produce a stepper motor. In this embodiment, the actuator undergoes a reciprocating motion. With each actuation cycle defined as switching on and off, a rack is advanced by a discrete step.

Figure 32:
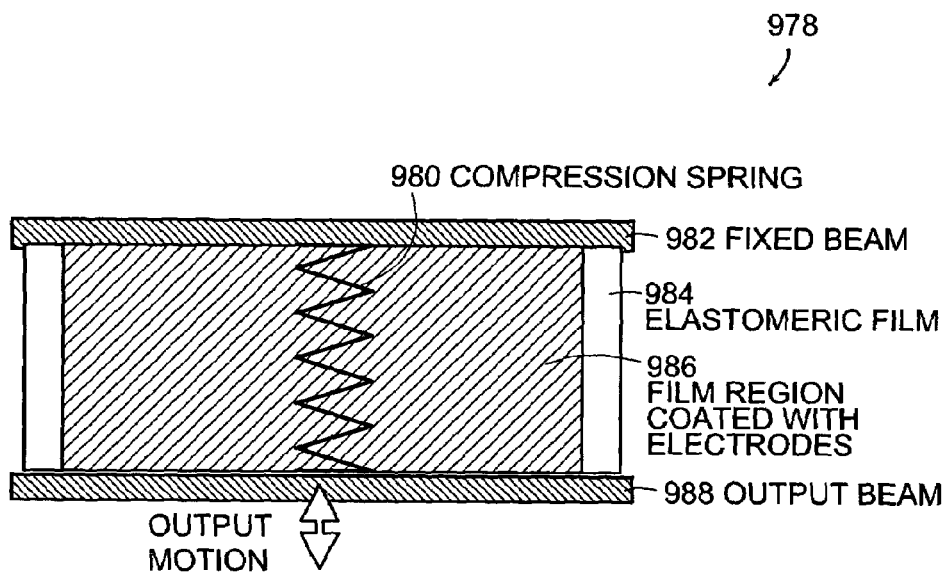
FIG. 32 illustrates a preferred embodiment having a parallel beam actuator with a spring to provide an elastic restoring force in accordance with the present invention.
Figure 33:
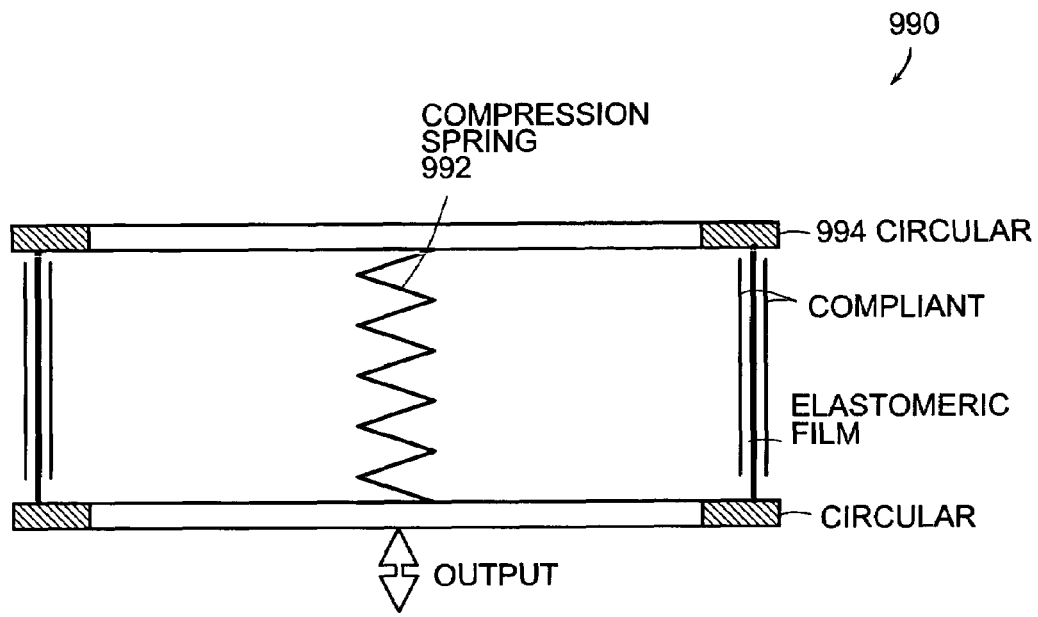
FIG. 33 illustrates a cross-sectional view of a cylindrical actuator with a spring to provide an elastic restoring force in accordance with a preferred embodiment of the present invention.
Figure 34:
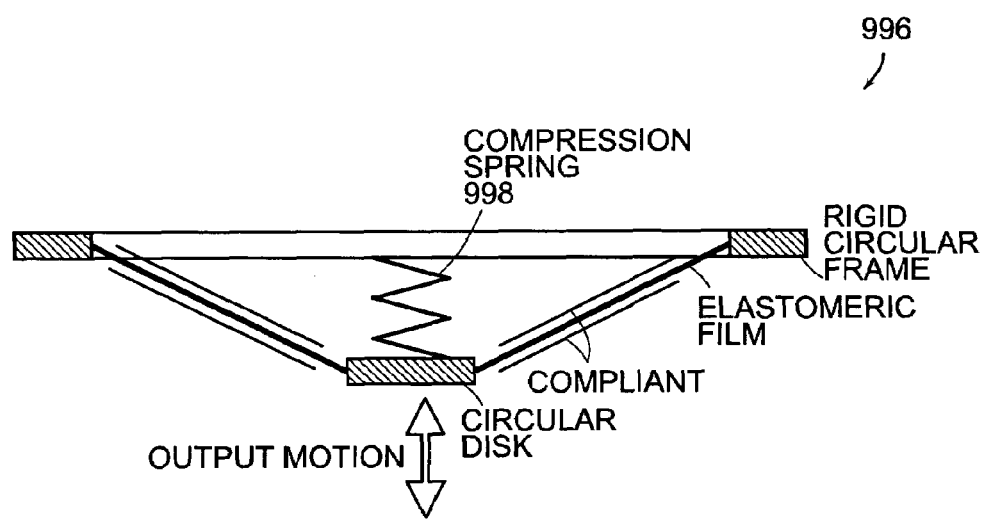
FIG. 34 illustrates a cross-sectional view of a conical actuator with a spring to provide an elastic restoring force in accordance with a preferred embodiment of the present invention.

As described hereinbefore, the elastomeric film has to be under tension for the actuator to function. The film itself is not able to work under compression. Thus, for an actuator that can work under both tension and compression, an external restoring force is necessary. This restoring force can be provided by a resilient elastic element, such as a spring as illustrated in FIGS. 32, 33 and 34. These figures illustrate a parallel beam actuator, a cylindrical actuator and a conical actuator, each having a spring to provide an elastic restoring force, respectively.

All of the actuators described hereinbefore can be further combined with a resilient elastic element that has an effective negative spring constant over at least part of its range of motion in accordance with a preferred embodiment. When combined in parallel with the actuator, such an element can increase the stroke of the actuator. It can further tune the force-displacement properties of the actuator module to meet certain applications. For many applications, it is desirable to have an actuator that produces a constant force throughout its stroke. In another embodiment, the actuation forces can be increased by using multiple layers of the elastomeric film and electrodes sandwich.

Figure 35B:
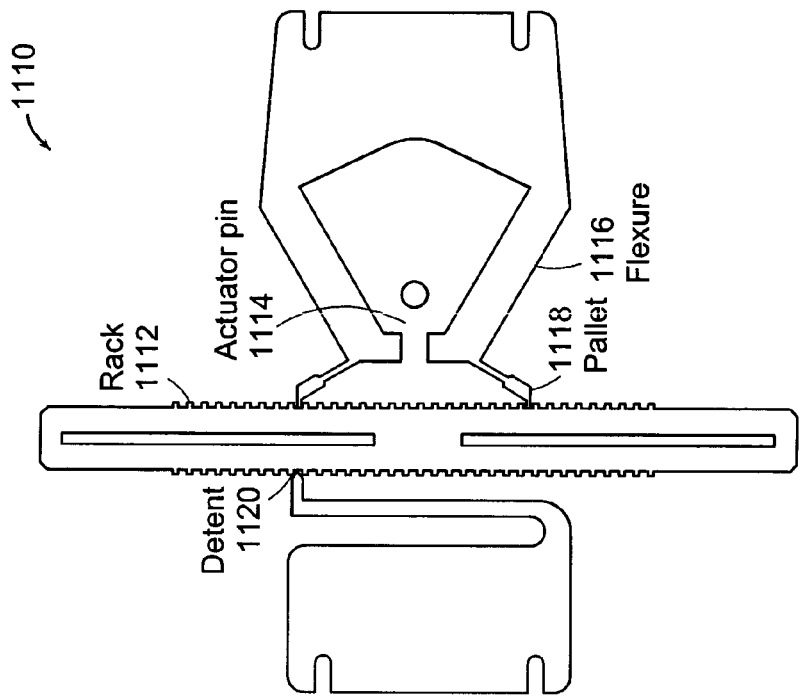
FIGS. 35A and 35B illustrate a preferred embodiment of a stepper motor including a dielectric elastomer actuator in accordance with the present invention.
Figure 35A:
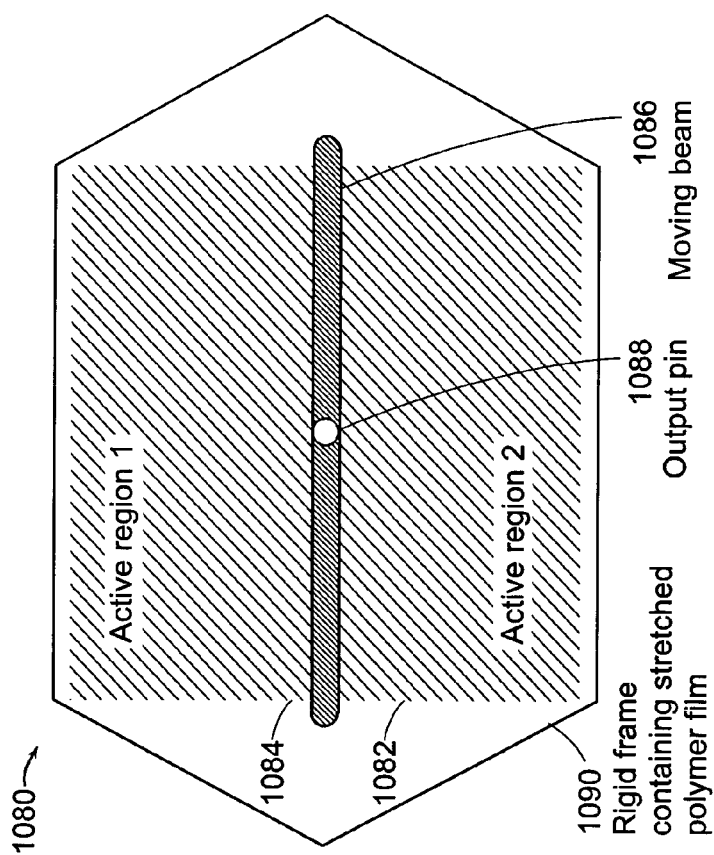

In a preferred embodiment, discrete and repeatable motion can be achieved by implementing the dielectric elastomer actuator as a stepper motor. One preferred embodiment is illustrated in FIGS. 35A and 35B and which includes two major components. One component includes dielectric polymer actuators that are arranged as an antagonistic pair, as shown in FIG. 35A. A rigid frame 1090 contains a stretched sheet of polymer film. Two regions 1082, 1084 are coated with compliant electrodes on both sides (active regions). These are separated by an output beam 1086 or shaft. Actuation of one of the regions causes it to expand, shifting the output beam. The output beam thus has a neutral position and depending on the region actuated, can move in one of two directions.

Discrete motion is achieved by combining this actuator pair with a ratcheting mechanism, which is shown in FIG. 35B. The output pin 1114 of the actuator is located between two flexure arms. As the output pin moves as a result of actuation, it will move the flexure arm causing the pallet 1118 to engage the teeth of the rack and advancing the rack 1112. The rack moves until the detent 1120 engages in the next tooth, holding the rack in place as actuator is switched off, allowing the flexure arm and pallet retract to its original position. Repeating this motion causes the rack to advance over a larger distance.

An alternate embodiment uses two flexible frame actuators in place of the antagonistic pair. This stepper motor has a flat geometry, allowing it to be used in confined spaces where a conventional electric motor might be inappropriate.

Figure 36A:
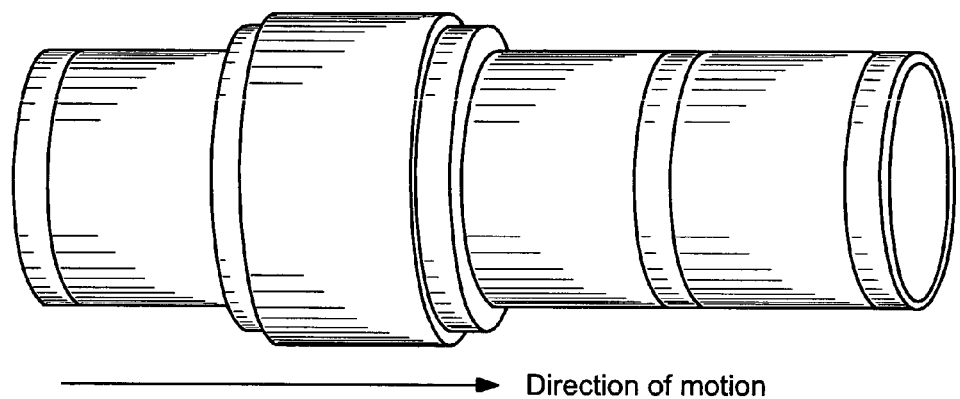
FIGS. 36A and 36B illustrate a preferred embodiment of a peristaltic pump including a dielectric elastomer actuator in accordance with the present invention.
Figure 36B:
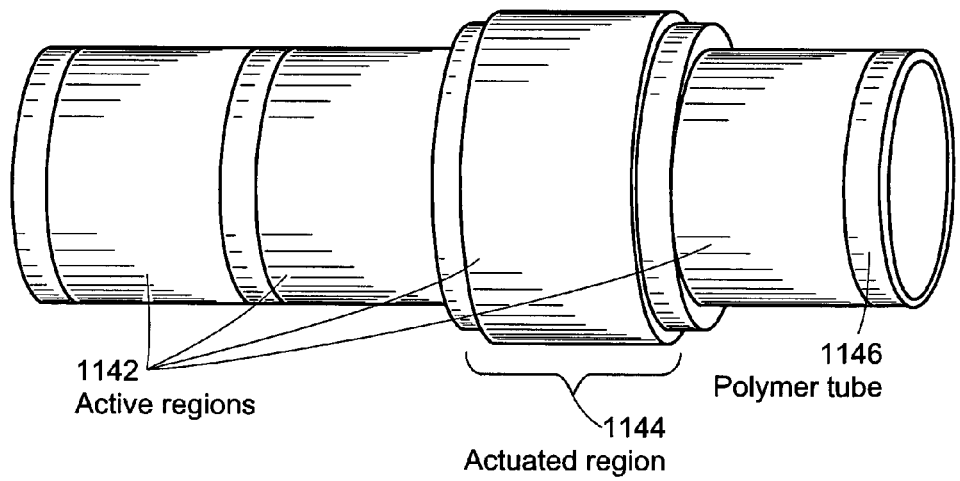

In a preferred embodiment, the dielectric elastomer actuators can be used as a pump that is based on peristaltic motion as illustrated in FIGS. 36A and 36B. The polymer film forms a tube 1146, which is divided into a number of sections along its length. Each section of the tube is covered with compliant electrodes on its inner and outer walls. Each section can be individually actuated, which causes it's diameter to expand, as shown in FIG. 36B. The peristaltic motion is achieved by timing the expansion of the individual sections to form a wave-like pattern. This embodiment might serve to advance fluids. For example, it might be used as a low-cost water pump.

Dielectric elastomer-based actuators can provide low cost alternatives to many currently mass-produced commercial devices. The actuator is very simple, as it requires only two components, the polymer film and compliant electrodes. Both materials are inexpensive, and can lead to significant cost savings over electric motors. They are also extremely lightweight.

Figure 37:
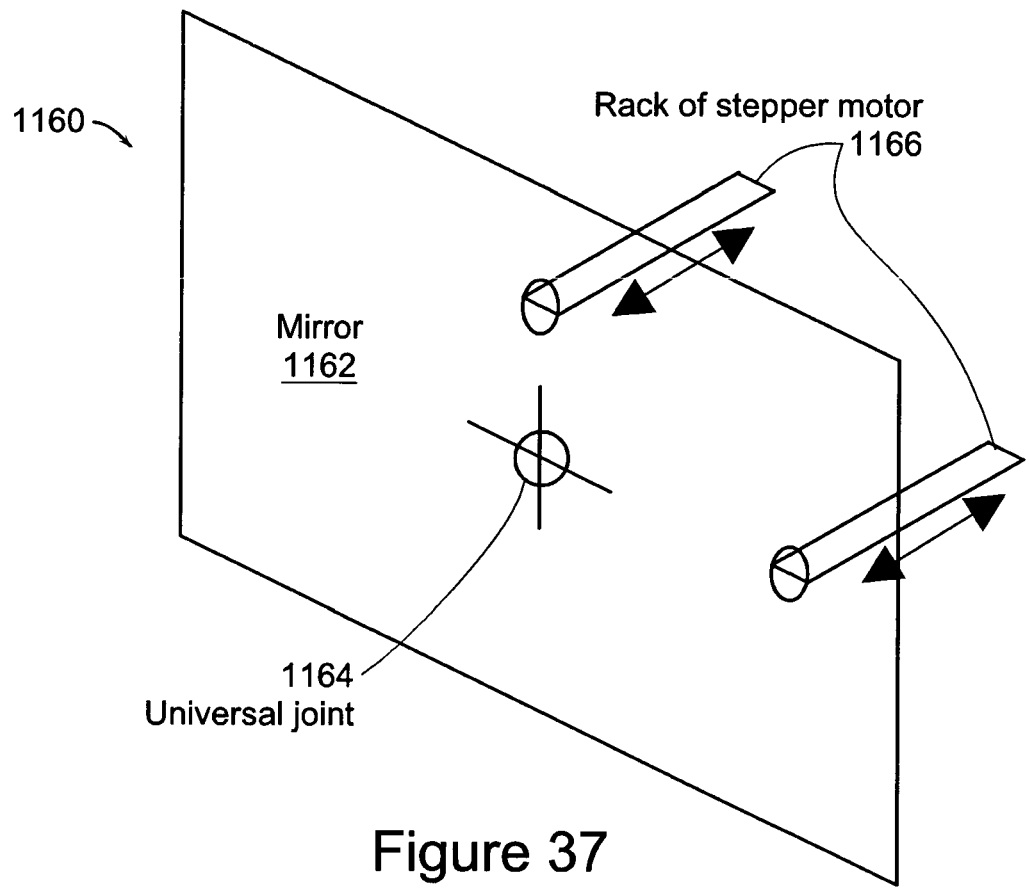
FIG. 37 is a schematic diagram of a preferred embodiment of an automotive mirror including a dielectric elastomeric actuator in accordance with the present invention.

In a preferred embodiment, the dielectric elastomeric actuators can be used to actuate car mirrors. Automotive outside rearview mirrors are adjustable by being able to pivot about two axis. In cars with power mirrors, each axis is commonly actuated with an electric motor. The stepper motor in accordance with the preferred embodiment illustrated with respect to FIGS. 35A and 35B is a simple and cost effective alternative to the prior art design. A schematic diagram using two stepper motors is shown in FIG. 37. The output-racks of each stepper motor 1166 are connected to the mirror 1162. As the racks advance and retract, they cause the mirror to pivot about a universal joint 1164 located at the center of the mirror.

Figure 38:
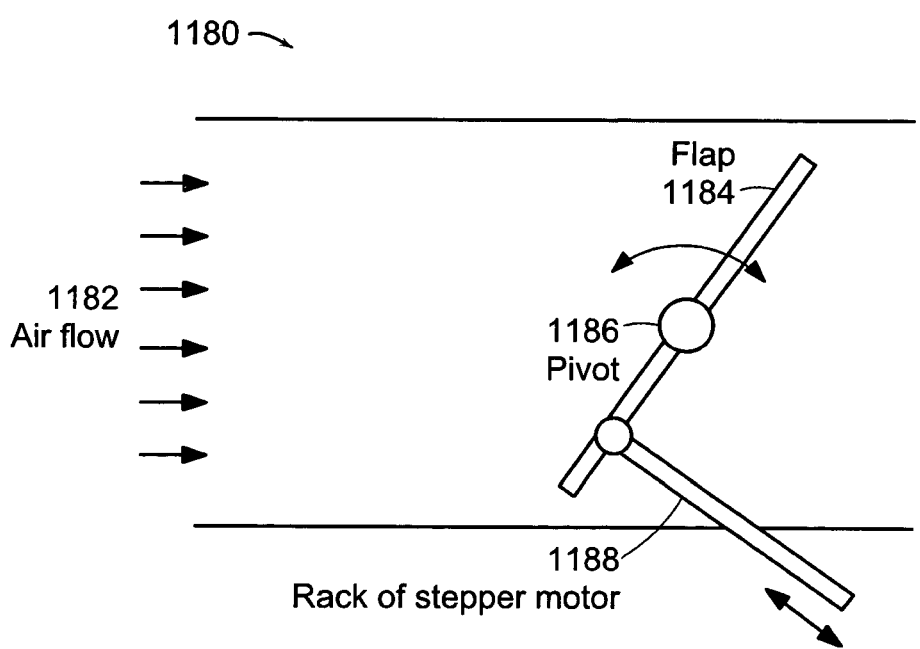
FIG. 38 is a schematic diagram of a preferred embodiment of an automotive ventilation valve including a dielectric elastomeric actuator in accordance with the present invention.

In another preferred embodiment, the airflow 1182 in an automotive ventilation system can be regulated using a valve actuated by a stepper motor described with respect to FIGS. 35A and 35B. FIG. 38 is a schematic diagram of an automotive ventilation valve 1180 in accordance with a preferred embodiment of the present invention. The rack 1188 of the stepper motor controls a flap 1184 that can be rotated by a number of discrete steps. The ventilation valve can be used in different heating, ventilation and air-conditioning systems.

Figure 39:
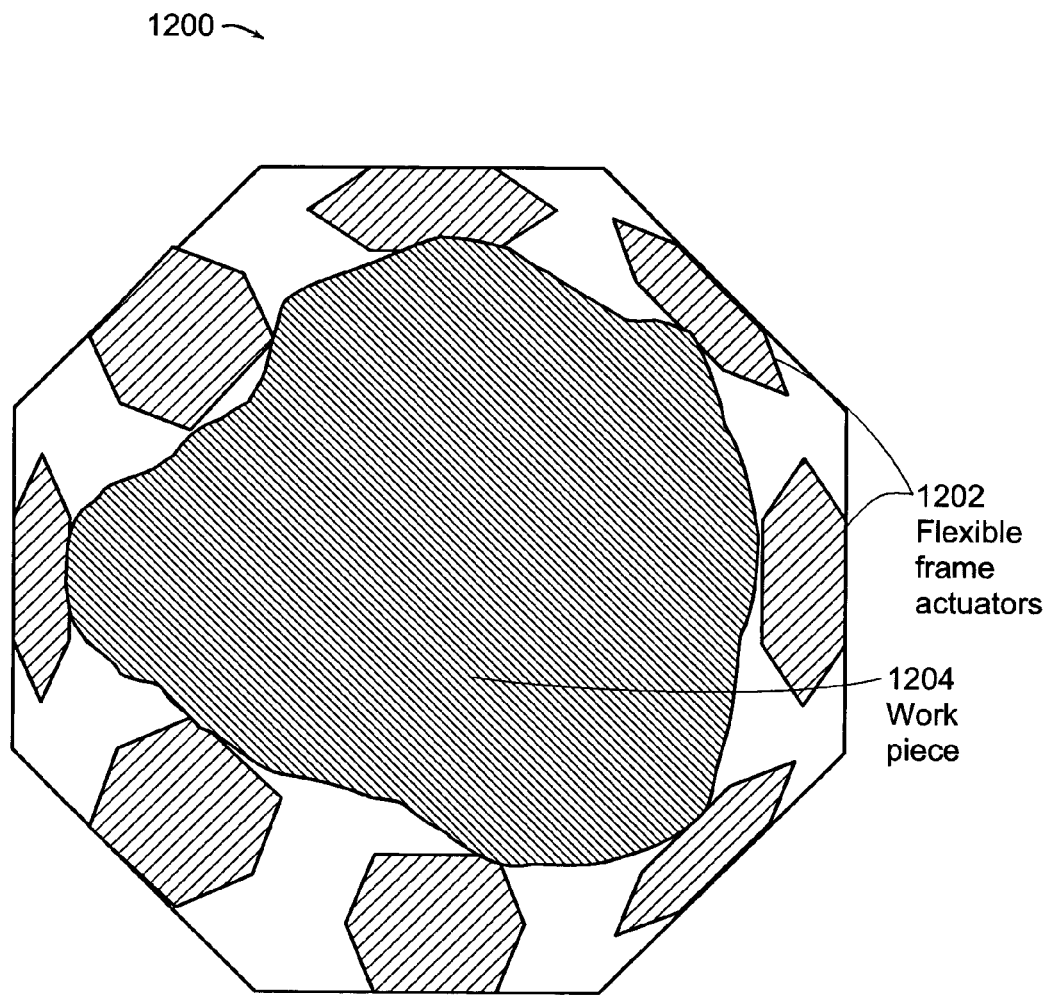
FIG. 39 is a diagram of a fixturing device including a dielectric elastomeric actuator in accordance with a preferred embodiment of the present invention.

In a preferred embodiment, an array of small flexible-frame actuators can be used to clamp or locate irregular-shaped objects for machining processes as illustrated in the diagram of a fixturing device in FIG. 39. A large number of small flexible-frame actuators 1202 are arranged such that they surround the work piece 1204. As they are actuated, they press against the work piece from all sides. The compliance of the actuators accommodates for the irregularities in shapes of the sample. The compliance further limits the maximum force applied, therefore allowing to safely clamp delicate parts.

The claims should not be read as limited to the described order or elements unless stated to that effect. Therefore, all embodiments that come within the scope and spirit of the following claims and equivalents thereto are claimed as the invention.

What is claimed:

1. A bistable actuator having at least two electrodes, comprising:
    a bistable element;
    an elastomeric dielectric polymer film disposed between the at least two electrodes, the film having a displacement range between a first position and a second position; and
    a frame attached to the bistable element and at least a portion of the film, the frame and the film moving between the first position and the second position in response to actuation by the electrodes to form a bistable actuator, the frame, the film and electrodes comprising an actuator that actuates the bistable element between a first bistable position and a second bistable position,
    wherein the displacement between the first position and second position is greater than about 5 mm, and the frame and the film have a linear actuation force characteristic that is within about ten percent of the applied actuation force over the displacement range.

2. The actuator of claim 1 wherein the frame further comprises at least two relatively rigid members coupled to a flexible element.

3. The actuator of claim 1 further comprising a plurality of layers of the elastomeric dielectric film attached to the frame.

4. The actuator of claim 2 wherein the relatively rigid members include one of parallel beams, curved beams, rods and plates.

5. The actuator of claim 1 wherein the elastomeric film comprises at least a layer of one of acrylic and silicone.

6. The actuator of claim 2 wherein the flexible element comprises one of links, and a continuous compliant member.

7. The actuator of claim 1 further comprising an antagonistic pair of actuators.

8. The actuator of claim 1 wherein the displacement range comprises stroke of the actuator.

9. The actuator of claim 1 wherein the film has one of a plurality of shapes.

10. The actuator of claim 9 wherein the plurality of shapes includes at least one of a cone, and a cylinder.

11. The actuator of claim 1 wherein the actuator remains in either the first position or the second position without the application of power to the electrodes.

12. The actuator of claim 1 wherein the film expands in a first direction and contracts in a second direction upon application of an electric field between the electrodes.

13. The actuator of claim 1 wherein the film extends in a plane parallel to an actuator plane in which the actuator moves between the first position and the second position.

14. A bistable actuator comprising:
    a bistable element;
    a first elastomeric dielectric polymer film disposed between a first electrode and a second electrode, the first film having a displacement range between a first position and a second position; and
    a first frame attached to the bistable element and at least a portion of the first film, the first frame and the first film moving between the first position and the second position in response to actuation by the first electrode and the second electrode;

a second elastomeric dielectric polymer film disposed between a third electrode and a fourth electrode, the second film having a displacement range between a third position and a fourth position;

a second frame attached to the bistable element and at least a portion of the second film, the second frame and the second film moving between the third position and the fourth position in response to actuation by the third electrode and the fourth electrode.

wherein the displacement between the first position and the second position is greater than about 5 mm and the frame and the film have a linear actuation force characteristic that is within about ten percent of the applied actuation force over the displacement range.

15. The actuator of claim 14 wherein the first frame further comprises at least two relatively rigid members coupled to a flexible element.

16. The actuator of claim 14 further comprising a plurality of layers of the elastomeric dielectric film attached to the first frame.

17. The actuator of claim 15 wherein the relatively rigid members include one of parallel beams, curved beams, rods and plates.

18. The actuator of claim 14 wherein the first elastomeric film comprises at least a layer of one of acrylic and silicone.

19. The actuator of claim 15 wherein the flexible element comprises one of links, and a continuous compliant member.

20. The actuator of claim 14 wherein the first frame and the second frame comprises an antagonistic pair of actuators.

21. The actuator of claim 14 wherein the, displacement range comprises a stroke of the actuator.

22. The actuator of claim 14 wherein the film has one of a plurality of shapes.

23. The actuator of claim 22 wherein the plurality of shapes includes at least one of a cone, and a cylinder.

24. The actuator of claim 14 wherein the film remains in the first position or the second position without the application of power to the first electrode and the second electrode.

* * * * *